United States Patent
Teachman et al.

(10) Patent No.: US 10,802,057 B2
(45) Date of Patent: Oct. 13, 2020

(54) SYSTEMS AND METHODS FOR MONITORING A POWER SYSTEM

(71) Applicant: SCHNEIDER ELECTRIC USA, INC., Andover, MA (US)

(72) Inventors: Michael Edward Teachman, Victoria (CA); John C. Van Gorp, Sidney (CA); Jon Andrew Bickel, Murfreesboro, TN (US); Johannes Menzel, Saint Hilaire du Trouvet (FR)

(73) Assignee: SCHNEIDER ELECTRIC USA, INC., Andover, MA (US)

( * ) Notice: Subject to any disclaimer, the term of this patent is extended or adjusted under 35 U.S.C. 154(b) by 0 days.

(21) Appl. No.: 16/695,838

(22) Filed: Nov. 26, 2019

(65) Prior Publication Data

US 2020/0116766 A1    Apr. 16, 2020

Related U.S. Application Data

(63) Continuation-in-part of application No. 14/966,720, filed on Dec. 11, 2015, now Pat. No. 10,540,790.

(51) Int. Cl.
| | |
|---|---|
| *G06F 3/048* | (2013.01) |
| *G01R 19/25* | (2006.01) |
| *G06F 3/0481* | (2013.01) |
| *G01R 21/00* | (2006.01) |
| *G01R 31/40* | (2020.01) |
| *G06F 3/01* | (2006.01) |

(52) U.S. Cl.
CPC ..... *G01R 19/2506* (2013.01); *G01R 19/2513* (2013.01); *G01R 21/001* (2013.01); *G01R 31/40* (2013.01); *G06F 3/0481* (2013.01)

(58) Field of Classification Search
CPC ............................. G06F 3/0481; G06F 3/0482
See application file for complete search history.

(56) References Cited

U.S. PATENT DOCUMENTS

| | | | |
|---|---|---|---|
| 5,894,311 A | 4/1999 | Jackson | |
| 6,049,828 A * | 4/2000 | Dev | ......................... B63B 5/06 709/224 |
| 6,487,457 B1 * | 11/2002 | Hull | ...................... G05B 15/02 700/17 |

(Continued)

OTHER PUBLICATIONS

"Alarm Setpoint Learning Saves Time", Schneider Electric, Sep. 28, 2004, <http://www.powerlogic.com/newsroom.cfm?press=57>.

*Primary Examiner* — Nicholas Augustine
(74) *Attorney, Agent, or Firm* — Lando & Anastasi, LLP

(57) ABSTRACT

A method for monitoring a power system includes receiving, from at least one component monitor in communication with components of the power system, a first set of readings for at least one of the power system components at an input of a central processing unit. The method also includes providing the first set of readings to be displayed in a graphical format on a user interface. A user selection of a portion of the first set of readings, and at least one user classification of the portion of the first set of readings, is received. Portions of the first set of readings are identified and removed based on the at least one user classification to generate a modified set of readings. The modified set of readings is classified by at least one characteristic, and the at least one characteristic is detected in a second set of readings.

27 Claims, 16 Drawing Sheets

(56) References Cited

U.S. PATENT DOCUMENTS

| | | | | |
|---|---|---|---|---|
| 6,615,408 | B1* | 9/2003 | Kaiser | G06Q 30/02 |
| | | | | 725/112 |
| 6,642,940 | B1* | 11/2003 | Dakss | G06F 16/748 |
| | | | | 715/723 |
| 6,721,689 | B2* | 4/2004 | Markle | H04L 41/0213 |
| | | | | 702/183 |
| 7,337,457 | B2* | 2/2008 | Pack | H04N 7/17318 |
| | | | | 348/E5.006 |
| 8,775,934 | B2 | 7/2014 | Nasle et al. | |
| 2002/0143872 | A1* | 10/2002 | Weiss | H04L 67/2838 |
| | | | | 709/204 |
| 2013/0173322 | A1 | 7/2013 | Gray | |
| 2014/0358293 | A1* | 12/2014 | Fadell | F24F 11/62 |
| | | | | 700/276 |
| 2015/0222495 | A1* | 8/2015 | Mehta | G06F 3/0484 |
| | | | | 715/736 |
| 2016/0335787 | A1* | 11/2016 | Martin | G06T 11/206 |
| 2017/0168656 | A1 | 6/2017 | Teachman et al. | |

* cited by examiner

SYSTEMS AND METHODS FOR MONITORING A POWER SYSTEM

CROSS REFERENCE TO RELATED APPLICATION

This application is a Continuation-in-Part (CIP) application of and claims the benefit of and priority to U.S. application Ser. No. 14/966,720, filed on Dec. 11, 2015, which application is incorporated by reference herein in its entirety.

FIELD

Aspects and embodiments of the present disclosure are directed to systems and methods for monitoring electrical systems (also commonly referred to as "power systems") and classifying data readings observed in such systems.

BACKGROUND

Existing monitoring systems can be configured to detect specific events occurring in an electrical system, such as voltage sags or spikes, undesirable harmonic content, outages, or other issues, and to preserve data recorded before, during, and after the event. Such systems may be configured to detect events that fall outside of user-defined setpoints. Yet such manually-defined setpoints are often cumbersome and inaccurate, in that measurements at different points in an electrical system may have different expected values during different application and operational cycles. For much the same reason, attempts to automatically adjust setpoints also have drawbacks, in that setpoints (whether automated or not) merely indicate when a reading exceeds the setpoint, and fail to take into account the context of a set of readings (i.e., a potential event or series of events) as a whole.

SUMMARY

According to one aspect of the present invention, a system is provided comprising a central processing unit configured to receive, from at least one component monitor, a first set of readings for a component of a power system, provide the first set of readings to be displayed as a graph on a user interface, receive, from the user interface, a user selection of a portion of the first set of readings, and at least one user classification of the portion of the first set of readings, determine at least one characteristic of the portion of the first set of readings, detect the at least one characteristic in a second set of readings, and apply the user classification to the second set of readings. According to one embodiment, the central processing unit is further configured to receive, from the user interface, a user selection of a notification profile, and generate, responsive to detecting the at least one characteristic in the second set of readings, a notification based on the notification profile. According to another embodiment, the central processing unit is further configured to receive, from a user input device, a selection of a geometric region of the graph of the first set of readings, and identify the portion of the first set of readings located within the geometric region.

According to one embodiment, the geometric region is a rectangle selectable by one of a computer mouse or trackball. According to one embodiment, the central processing unit is further configured to perform an action on the power system responsive to the application of the user classification to the second set of readings. According to one embodiment, the central processing unit is further configured to determine a trend in the portion of the first set of readings and to detect the trend in the second set of readings, wherein the trend in the second set of readings occurs over a different length of time than the portion of the first set of readings. According to one embodiment, the central processing unit is further configured to receive a user selection of at least one tag to be applied to the portion of the first set of readings. According to another embodiment, the at least one tag corresponds to an event affecting the component of the power system.

According to one embodiment, a method of detecting events in a power distribution system is provided comprising receiving, from at least one component monitor, a first set of readings for a component of a power system, displaying a graph of the first set of readings on a user interface, receiving, from the user interface, a user selection of a portion of the first set of readings, and at least one user classification of the portion of the first set of readings, determining at least one characteristic of the portion of the first set of readings, detecting the at least one characteristic in a second set of readings, and applying the user classification to the second set of readings. According to one embodiment, the method further comprises the act of receiving, from the user interface, a user selection of a notification profile, and responsive to detecting the at least one characteristic in the second set of readings, generating a notification based on the notification profile. According to another embodiment, the method further comprises the act of determining a confidence level for the application of the user classification to the second set of readings. According to yet another embodiment, the method of receiving, from the user interface, a user selection of a portion of the first set of readings comprises receiving, from a user input device, a selection of a geometric region of the graph of the first set of readings, and identifying the portion of the first set of readings located within the geometric region.

According to one embodiment, the geometric region is a rectangle selectable by one of a computer mouse or trackball. According to one embodiment, the method further comprises performing an action on the power system responsive to the application of the user classification to the second set of readings. According to one embodiment, the method of determining at least one characteristic of the portion of the first set of readings comprises determining a trend in the portion of the first set of readings, and wherein detecting the at least one characteristic in the second set of readings comprises detecting the trend in the second set of readings, wherein the trend in the second set of readings occurs over a different length of time than the portion of the first set of readings. According to one embodiment, the method of receiving, from the user interface, at least one user classification of the portion of the first set of readings further comprises receiving, from a user, a user selection of a first tag to be applied to the portion of the first set of readings. According to one embodiment, the method further comprises providing, in the user interface, the option to select the first tag to be applied to the portion of the first set of readings. According to another embodiment, the first tag corresponds to an event affecting the component of the power system.

According to another embodiment, the method of receiving, from the user interface, at least one user classification of the portion of the first set of readings further comprises receiving, from a second user, a second user selection of a second tag to be applied to the portion of the first set of readings. According to one embodiment, the method further comprises acts of determining that the first tag differs from the second tag, ascertaining which proposed tag of the first tag and the second tag has been selected by a greater number of users to be applied to the portion of the first set of readings, and applying the proposed tag to the portion of the first set of readings. According to another embodiment, the method of further comprises acts of determining that the first tag differs from the second tag, calculating tag statistics comprising a number of users that have applied the first tag to the portion of the first set of readings and a number of users that have applied the second tag to the portion of the first set of readings, and displaying the first tag, the second tag, and the tag statistics to a user of the user interface. According to yet another embodiment, the first tag indicates whether the portion of the first set of readings corresponds to a normal function of the component of the power system.

According to another embodiment, a system for monitoring a power system includes one or more component monitors in communication with components of the power system and configured to measure electrical or performance characteristics of the power system components or the power system. The system for monitoring the power system also includes a central processing unit in communication with the component monitors. The central processing unit is configured to receive, from at least one of the component monitors, a first set of readings for at least one of the power system components; and provide the first set of readings to be displayed in a graphical format on a user interface. The central processing unit is also configured to receive, from the user interface, a user selection of a portion of the first set of readings, and at least one user classification of the portion of the first set of readings; and determine at least one characteristic of the portion of the first set of readings based on the at least one user classification.

The central processing unit is additionally configured to detect the at least one characteristic in a second set of readings based on similarity(s) and/or dis-similarity(s) between the first set of readings and the second set of readings, for example, independent of a time period of the first set of readings and the second set of readings. In some embodiments, the similarity(s) and/or dis-similarity(s) are identified based on a correlation/covariance and/or similar/dissimilar traits/shapes, and/or density or statistical distributions, and/or using time series statistical or machine learning clustering (which combines similarity (intra-cluster) and dis-similarity (inter-clusters) calculations), and/or characteristics and/or trends and/or extreme values and/or variance calculations and/or any other existing or future algorithm which aims at grouping similar measurements or separating dis-similar measurements, between the first set of readings and the second set of readings. In some embodiments, the similar/dissimilar traits or characteristics may include, for example, any measurement (e.g., voltage and/or current measurements, etc.) and/or derived characteristic(s) (e.g., root-mean-square (RMS) values, phase angles, power factor, etc.). In some embodiments, the derived characteristics may include any other, more complex, derived characteristic such as similarity, distance or grouping calculation (e.g., shape analysis, time series clustering, Principal Component Analysis dimension reduction of characteristics, and any other data science state of the art distance or similarity or grouping or other present or future equivalent or enhanced algorithms, etc.). As is known, time series clustering, for example, is to partition time series data into groups based on similarity or distance, so that time series in the same cluster are similar.

The central processing unit is further configured to automatically apply the at least one user classification to the second set of readings in response to the at least one characteristic being detected in the second set of readings based on the similarity(s) and/or dis-similarity(s), or correlation or common characteristic or any other similarity, distance or grouping calculation, between the first set of readings and the second set of readings. A controller in communication with the central processing unit and the power system components is configured to control or perform an operation on one or more aspects of the power system in response to the at least one user classification being applied to the second set of readings.

In some embodiments, the power system components include at least one of a generator, a transformer, a power conditioner, an inverter, a bus, a rectifier and a transmission line. It is understood that these are but a few of many potential power system components. In some embodiments the electrical or performance characteristics measured by the component monitors include at least one of voltage, current, resistance, phases, power load and impedance. In some embodiments, the at least one of the component monitors from which the first set of readings is received includes two component monitors working in tandem. In one example configuration, one of the two component monitors is connected to a circuit inline before the component (i.e. upstream), and the other one of the two component monitors is connected to the circuit inline after the component (i.e., downstream). Data from the two component monitors may be combined to provide the first set of readings, for example.

As used herein, the terms "upstream" and "downstream" are used to refer to electrical locations within a power system. More particularly, in one embodiment the electrical locations "upstream" and "downstream" are relative to an electrical location of a component monitoring (or metering device) collecting data and providing this information. For example, in a power system including a plurality of component monitors, one or more component monitors may be positioned (or installed) at an electrical location that is upstream relative to one or more other component monitors in the power system, and the one or more component monitors may be positioned (or installed) at an electrical location that is downstream relative to one or more further component monitors in the power system.

In some embodiments, the at least one user classification corresponds to an identified power event, for example, a power quality event, in the power system. The power quality event may include, for example, at least one of: a voltage sag, a voltage swell, a voltage transient, an instantaneous interruption, a momentary interruption, a temporary interruption, waveform distortion, power frequency variation, imbalance, and a long-duration root-mean-square (rms) variation. In some embodiments, the one or more aspects of the power system that are controlled or on which the operation is performed include one or more of the power system components.

In some embodiments, the central processing unit of the system for monitoring the power system is further configured to receive, from the user interface, a user selection of a notification profile; and generate, responsive to detecting the at least one characteristic in the second set of readings, a notification based on the notification profile. Additionally, in some embodiments the central processing unit is further configured to determine a trend or characteristic or similarity/dis-similarity analysis calculation in the portion of the first set of readings and to detect the trend or characteristics or similarity in the second set of readings. The trend or characteristic or similarity in the second set of readings occurs over a different length of time than the portion of the first set of readings in some embodiments. In some embodiments, the central processing unit may store at least one of the first set of readings and the second set of readings on a memory device of the system.

According to a further embodiment, a method for monitoring a power system includes receiving, from at least one component monitor in communication with components of the power system, a first set of readings for at least one of the power system components at an input of a central processing unit. The method also includes providing the first set of readings to be displayed in a graphical format on a user interface; and receiving, from the user interface, a user selection of a portion (or portions) of the first set of readings, and at least one user classification of the portion(s) of the first set of readings. The method additionally includes determining at least one characteristic of the portion(s) of the first set of readings based on the at least one user classification; and detecting the at least one characteristic in a second set of readings based on similarity(s) and/or dis-similarity(s) between the first set of readings and the second set of readings, independent of a time period of the first set of readings and the second set of readings. The method further includes automatically applying the at least one user classification to the second set of readings in response to the at least one characteristic being detected in the second set of readings based on the similarity(s) and/or dis-similarity(s) between the first set of readings and the second set of readings. The method also includes controlling or performing, using a controller in communication with the central processing unit and the power system components, an operation on one or more aspects of the power system in response to the at least one user classification being applied to the second set of readings.

In some embodiments, the method further includes determining a confidence level for the application of the user classification to the second set of readings, for example, as described in the Detailed Description section of this disclosure. Additionally, in some embodiments determining at least one characteristic of the portion(s) of the first set of readings includes determining a trend in the portion(s) of the first set of readings, and detecting the at least one characteristic in the second set of readings comprises detecting the trend in the second set of readings. The trend in the second set of readings may occurs over a same or different length of time than the portion(s) of the first set of readings in some embodiments.

In some embodiments, the act of receiving, from the user interface, at least one user classification of the portion(s) of the first set of readings, includes receiving, from a user, a user selection of a first tag to be applied to the portion(s) of the first set of readings. The method may further include providing, in the user interface, the option to select the first tag to be applied to the portion(s) of the first set of readings. In some embodiments, the first tag corresponds to an event affecting the at least one power system component.

In some embodiments, the act of receiving, from the user interface, at least one user classification of the portion(s) of the first set of readings, further includes receiving, from a second user, a second user selection of a second tag to be applied to the portion(s) of the first set of readings. In some embodiments, the method may further include determining that the first tag differs from the second tag; ascertaining which proposed tag of the first tag and the second tag has been selected by a greater number of users to be applied to the portion(s) of the first set of readings; and applying the proposed tag to the portion(s) of the first set of readings. In some embodiments, the tag(s) may additionally or alternatively be compared to characteristics in a library of events that have been tagged by experts or have been determined based on a root cause analysis of the event before applying the proposed tag to the portion(s) of the first set of readings.

In some embodiments, the method may further include determining that the first tag differs from the second tag and comparing the first and second tags to a library of validated tagged data. Validation may be made by subject matter experts or by the outcome of an investigation or the like, for example. In some embodiments, the first tag indicates whether the portion(s) of the first set of readings corresponds to a normal function of the at least one power system component.

According to another embodiment, a method for monitoring a power system includes receiving, from at least one component monitor in communication with components of the power system, a first set of readings for at least one of the power system components at an input of a central processing unit. The method also includes providing the first set of readings to be displayed in a graphical format on a user interface. A user selection of a portion (or portions) of the first set of readings, and at least one user classification of the portion of the first set of readings, may be received, for example, from the user interface. In some embodiments, at least one of the user selection and the user classification is at least partially audibly communicated to a user input device (e.g., a microphone or smart speaker) based on a viewing of the first set of readings in the user interface. The at least one user classification may indicate "normal" non-issue data, for example. In accordance with one embodiment of this disclosure, the "normal" non-issue data corresponds to data/values that are within the specification of the equipment being supplied (i.e., data/values that are typical or acceptable for the equipment). For example, a system may be designed to supply a nominal voltage on all three phases that is within the appropriate range. "Normal" non-issue data may be within the nominal range, in amplitude, frequency and phase angle, for example. In accordance with embodiments of this disclosure, "normal" non-issue data should be typical data that is not problematic or not potentially problematic for customer equipment. However, based on one example implementation of this invention, non-issue data may be at the discretion of the customer to determine, based on what they select as "normal" non-issue data.

In another embodiment of this disclosure, any statistical "most frequent" behavior may be tagged as the "normal". In this case this would be the most frequent (i.e., steady-state) running mode of a load (e.g., a boiler, variable speed drive, a motor, a capacitor bank, just to mention a few). In this embodiment, the system may tag as normal any most frequent waveform profile (possibly by calculating different occurring patterns using time series clustering as just one example of profile calculations and identification and of their frequency calculation to define what is the "most frequent" profile) without any evaluation of the respect of the appliances specifications. This then may be used to either show a user or expert for focus and for validation as "on specification" (in this case the expert will refer to the definition of the previous embodiment), or may be used by the system to hide the most frequent behaviors and to focus on the less frequent profiles. This may be very useful when a profile is not noticeably "out of a specification range" and thus more difficult to classify by users without prior groupings (and the user doesn't know which is the "most frequent profile". In some embodiments, several profiles or behaviors may be tagged as "normal" (e.g., "most frequent") based on some rule (such as non-limitative example would be to tag as "normal" any cluster representing at least 20% of the number of all measurements).

The method also includes identifying and removing portions of the first set of readings based on the at least one user classification to generate a modified set of readings. The modified set of readings may correspond to "abnormal" potential issue data in the first set of readings, for example. In accordance with one embodiment of this disclosure, "abnormal" potential issue data is the opposite (or substantially the opposite) of the "normal" non-issue data discussed above. For example, "abnormal" potential issue data may not be within the nominal range (normal range) in either amplitude, frequency and/or phase angle. It may also have non-power frequency signals superimposed on the power frequency signal. Normal is within some recommended threshold or thresholds; it is expected. Abnormal is outside some recommended threshold or thresholds; it is unexpected. In another embodiment, "abnormal" may simply mean that it is "not the most frequent behavior or profile". This then helps the user or expert to analyze and compare different "normal" and "abnormal" profiles or behaviors.

The method additionally includes classifying the modified set of readings by at least one characteristic and detecting the at least one characteristic in a second set of readings, for example, based on similarity(s) and/or dis-similarity(s) between the first set of readings and the second set of readings. The method further includes automatically classifying the second set of readings in response to the at least one characteristic being detected in the second set of readings, for example, based on the similarity(s) and/or dis-similarity(s) between the first set of readings and the second set of readings. An operation on one or more aspects of the power system may be controlled or performed, for example, using a controller in communication with the central processing unit and the power system components, in response to the second set of readings being classified in response to the at least one characteristic being detected in the second set of readings. For example, once an abnormal event has been identified through this process, it would be possible to perform an action such as turning a load(s) off, inhibiting a load(s) from running, order replacement parts, shutting down a line, and so forth. Other example operations include installing a mitigative device such as a diesel generator, throw-over or static switch, etc., and adjusting parameters associated with a load, for example, as described in co-pending U.S. patent application Ser. No. 16/233,220, entitled "Systems and Methods for Characterizing Power Quality Events in an Electrical System," which is assigned to the same assignee as the present disclosure. Another example would be for a user to perform an additional expert-based tagging of "most frequent events" into new, more precisely named groups, reflecting what could be impactful or non-impactful to the loads, appliances or processes.

In some embodiments, the at least one characteristic is associated with one or more potential issues in the power system. In some embodiments, the potential issues include power quality issues in the power system. The power quality issues may include, for example, at least one of: a voltage sag, a voltage swell, a voltage transient, an instantaneous interruption, a momentary interruption, a temporary interruption, waveform distortion, power frequency variation, imbalance, and a long-duration root-mean-square (rms) variation.

It is understood that other types of power quality issues/events may also negatively affect power quality of the power system. In general, it is understood there are types of power quality issues/events and there are certain characteristics associated with these types of power quality events. Below is a table from IEEE Standard 1159-2019 (known art), which defines various categories and characteristics of power system electromagnetic phenomena.

| Categories | Typical spectral content | Typical duration | Typical voltage magnitude |
|---|---|---|---|
| 1.0 Transients | | | |
|   1.1 Impulsive | | | |
|     1.1.1 Nanosecond | 5 ns rise | <50 ns | |
|     1.1.2 Microsecond | 1 µs rise | 50 ns-1 ms | |
|     1.1.3 Millisecond | 0.1 ms rise | >1 ms | |
|   1.2 Oscillatory | | | |
|     1.2.1 Low frequency | <5 kHz | 0.3-50 ms | 0-4 pu$^a$ |
|     1.2.2 Medium frequency | 5-500 kHz | 20 µs | 0-8 pu |
|     1.2.3 High frequency | 0.5-5 MHz | 5 µs | 0-4 pu |
| 2.0 Short-duration root-mean-square (rms) variations | | | |
|   2.1 Instantaneous | | | |
|     2.1.1 Sag | | 0.5-30 cycles | 0.1-0.9 pu |
|     2.1.2 Swell | | 0.5-30 cycles | 1.1-1.8 pu |
|   2.2 Momentary | | | |
|     2.2.1 Interruption | | 0.5 cycles-3 s | <0.1 pu |
|     2.2.2 Sag | | 30 cycles-3 s | 0.1-0.9 pu |
|     2.2.3 Swell | | 30 cycles-3 s | 1.1-1.4 pu |
|     2.2.4 Voltage Imbalance | | 30 cycles-3 s | 2%-15% |
|   2.3 Temporary | | | |
|     2.3.1 Interruption | | <3 s-1 min | <0.1 pu |
|     2.3.2 Sag | | 3 s-1 min | 0.1-0.9 pu |
|     2.3.3 Swell | | 3 s-1 min | 1.1-1.2 pu |
|     2.3.4 Voltage Imbalance | | 3 s-1 min | 2%-15% |
| 3.0 Long duration rms variations | | | |
|   3.1 Interruption, sustained | | >1 min | 0.0 pu |
|   3.2 Undervoltages | | >1 min | 0.8-0.9 pu |
|   3.3 Overvoltages | | >1 min | 1.1-1.2 pu |
|   3.4 Current overload | | >1 min | |

-continued

| Categories | Typical spectral content | Typical duration | Typical voltage magnitude |
|---|---|---|---|
| 4.0 Imbalance | | | |
|   4.1 Voltage | | steady state | 0.5-5% |
|   4.2 Current | | steady state | 1.0-3.0% |
| 5.0 Waveform distortion | | | |
|   5.1 DC offset | | steady state | 0-0.1% |
|   5.2 Harmonics | 0-9 kHz | steady state | 0-20% |
|   5.3 Interharmonics | 0-9 kHz | steady state | 0-2% |
|   5.4 Notching | | steady state | |
|   5.5 Noise | broadband | steady state | 0-1% |
| 6.0 Voltage fluctuations | <25 Hz | intermittent | 0.1-7% |
| | | | 0.2-2 $P_{st}^{b}$ |
| 7.0 Power frequency variations | | <10 s | ±0.10 Hz |

NOTE
These terms and categories apply to power quality measurements and are not to be confused with similar terms defined in IEEE Std 1366 ™-2012 [B30] and other reliability-related standards, recommended practices, and guides.
$^{a}$The quantity pu refers to per unit, which is dimensionless. The quantity 1.0 pu corresponds to 100%. The nominal condition is often considered to be 1.0 pu. In this table, the nominal peak value is used as the base for transients and the nominal rms value is used as the base for rms variations.
$^{b}$Flicker severity index $P_{st}$ as defined IEC 61000-4-15: 2010 [B17] and IEEE Std 1453 ™ [B31].

It is understood that the above table is one standards body's (IEEE in this case) way of defining/characterizing power quality events. It is understood there are other standards that define may power quality categories/events as well, such as the International Electrotechnical Commission (IEC), American National Standards Institute (ANSI), National Electrical Manufacturers Association (NEMA), Copper Development Association, etc., which may have different descriptions or power quality event types, characteristics, and terminology. It is also understood that the types and descriptions of power quality events may change over time, and the systems and methods disclosed herein are intended to be applicable to current and future types and descriptions of power quality events. In accordance with embodiments of this disclosure, power quality events (e.g., transient voltages) may additionally or alternatively be customized power quality events (e.g., defined by a user).

Returning to the above-discussed method, in some embodiments classifying the modified set of readings by at least one characteristic includes automatically sorting the "abnormal" potential data into one or more categories. In some embodiments, the categories include one or more power quality categories, the power quality categories including at least one of sags, swells, frequency variations, phase imbalance, waveform distortion, transients, or categories similar to those listed in the IEEE table above, for example. In some embodiments, the categories include at least one of real, reactive, apparent power changes, and power factor changes. In some embodiments, at least some of the categories are associated with frequency-based categories, the frequency-based categories including at least one of: total voltage and/or current harmonic distortion, a specific harmonic component(s), interharmonic(s) distortion, and sub-harmonic distortion, for example. In some embodiments, at least some of the categories are based on sequence component values, the sequence component values including at least one of: positive, negative, zero sequence voltage(s) and current(s), for example. In some embodiments, the categories include non-energy-related characteristics, the non-energy-related characteristics including at least one of: data, time, load type(s), process, load related status change(s) (e.g., "on/off"), shift, manufacturer, location, metadata, and meter type, for example. In some embodiments, at least some of the categories are based on events, warning and alarms data.

In some embodiments, subsequent to automatically classifying the second set of readings, the method further includes evaluating each classification for additional common or dissimilar characteristics within the classification to identify new classifications or sub-classifications. In some embodiments, the at least one characteristic and/or the additional common or dissimilar characteristics are detected in a third set (and subsequent sets) of readings based on a correlation or any other similarity or dis-similarity calculation between at least one of the first and second sets of readings and the third set (and subsequent sets) of readings. The third set (and subsequent sets) of readings may be automatically classified in response to the at least one characteristic and/or the additional common or dissimilar characteristics being detected in the third set (and subsequent sets) of readings based on the correlation or any other similarity or dis-similarity calculation between at least one of the first and second sets of readings and the third set (and subsequent sets) of readings.

In some embodiments, evaluating each classification for additional similar or dissimilar characteristics within the classification to identify new classifications or sub-classifications includes identifying trends or patterns in at least one of the first and second sets of readings to identify new classifications or sub-classifications. In some embodiments, evaluating each classification for additional common or dissimilar characteristics to identify trends or patterns includes identifying optimal change points to slice the measurement into most discriminant and coherent classifications or sub-classifications. In some embodiments, identifying the optimal change points includes optimizing the change point identification in a coherent way to adjust and correct approximate user selections. Additionally, in some embodiments identifying optimal change points to slice the measurement into most discriminant and coherent classifications or sub-classifications includes identifying missing change points to link to existing sub-classifications or to identify missing classifications, for example, illustrated in FIGS. 6A-6C, as will be described further below. In some embodiments, after optimizing the change point identification or after identifying missing change points or identifying missing sub-classifications, a user validation step or completion step may be provided, for example, from the system to a user (or users).

In some embodiments, in response to identifying new classifications or sub-classifications, the new classifications or sub-classifications may be compared with current classifications to determine differences between the current classifications and the new classifications or sub-classifications, and/or overlap between the current classifications and the new classifications or sub-classifications. In some embodiments, it may be determined if there have been any misclassifications and/or if at least one of the first and second sets of readings needs to be reclassified based on the determined differences and/or overlap between the current classifications and the new classifications or sub-classifications. In some embodiments, the method further includes evaluating each of the new classifications or sub-classifications and/or overlaps to identify optimal change points to slice the measurement into most discriminant and coherent classifications or sub-classifications. In some embodiments, evaluating each of the new classifications or sub-classifications and/or overlaps to identify optimal change points includes optimizing the change point identification in a coherent way to adjust and correct approximate user selections, for example, illustrated in FIGS. 6A-6C, as will be described further below. In some embodiments, in response to determining that there have been misclassifications and/or at least one of the first and second sets of readings needs to be reclassified, at least one of the first and second sets of readings may be processed to reclassify the first and/or second sets of readings.

In some embodiments, it may be determined if there are any unclassified readings, and in response to determining there is at least one unclassified reading, new abnormal readings that are unclassified may be identified and indicated. The unclassified readings may be classified by at least the at least one characteristic, for example.

According to another embodiment, a system for monitoring a power system includes one or more component monitors in communication with components of the power system and configured to measure electrical or performance characteristics of the power system components or the power system. The system for monitoring the power system also includes a central processing unit in communication with the component monitors. The central processing unit is configured to receive, from at least one of the component monitors, a first set of readings for at least one of the power system components at an input of a central processing unit. The central processing unit is also configured to provide the first set of readings to be displayed in a graphical format on a user interface; and receive a user selection of a portion of the first set of readings, and at least one user classification of the portion of the first set of readings. The at least one user classification may indicate "normal" non-issue data, for example. The central processing unit is also configured to identify and remove portions of the first set of readings based on the at least one user classification to generate a modified set of readings. The modified set of readings may correspond to "abnormal" potential issue data in the first set of readings, for example. The central processing unit is also configured to classify the modified set of readings by at least one characteristic and detect the at least one characteristic in a second set of readings, for example, based on a correlation or any other similarity or dis-similarity calculation between the first set of readings and the second set of readings. The central processing unit is also configured to automatically classify the second set of readings in response to the at least one characteristic being detected in the second set of readings, for example, based on the correlation or any other similarity or dis-similarity calculation between the first set of readings and the second set of readings.

The system for monitoring the power system also includes a controller in communication with the central processing unit and the power system components. The controller is configured to control or perform an operation on one or more aspects of the power system in response to the second set of readings being classified in response to the at least one characteristic being detected in the second set of readings.

It is understood that while the readings (e.g., first and/or second sets of readings) are described as being received from at least one component monitor in the power system, in some embodiments the readings may be received further up in the electrical hierarchy, for example, relevant for a process, not just one component unless the component includes levels that are closer to the top of the electrical system's hierarchy. The at least one component monitor may take the form of an intelligent electronic device (IED), for example.

As used herein, an IED is a computational electronic device optimized to perform a particular function or set of functions. Examples of IEDs include smart utility meters, power quality meters, microprocessor relays, digital fault recorders, and other metering devices. IEDs may also be imbedded in variable speed drives (VSDs), uninterruptible power supplies (UPSs), circuit breakers, relays, transformers, or any other electrical apparatus. IEDs may be used to perform monitoring and control functions in a wide variety of installations. The installations may include utility systems, industrial facilities, warehouses, office buildings or other commercial complexes, campus facilities, computing co-location centers, data centers, power distribution networks, or any other structure, process or load that uses electrical energy. For example, where the IED is an electrical power monitoring device, it may be coupled to (or be installed in) an electrical power transmission or distribution system and configured to sense/measure and store data as electrical parameters representing operating characteristics—(e.g., voltage, current, waveform distortion, power, etc.) of the electrical distribution system. These parameters and characteristics may be analyzed by a user to evaluate potential performance, reliability and/or power quality-related issues, for example. The IED may include at least a controller (which in certain IEDs can be configured to run one or more applications simultaneously, serially, or both), firmware, a memory, a communications interface, and connectors that connect the IED to external systems, devices, and/or components at any voltage level, configuration, and/or type (e.g., AC, DC). At least certain aspects of the monitoring and control functionality of an IED may be embodied in a computer program that is accessible by the IED.

In some embodiments, the term "IED" as used herein may refer to a hierarchy of IEDs operating in parallel and/or tandem. For example, an IED may correspond to a hierarchy of energy meters, power meters, and/or other types of resource meters. The hierarchy may comprise a tree-based hierarchy, such a binary tree, a tree having one or more child nodes descending from each parent node or nodes, or combinations thereof, wherein each node represents a specific IED. In some instances, the hierarchy of IEDs may share data or hardware resources and may execute shared software. It is understood that hierarchies may be non-spatial such as billing hierarchies where IEDs grouped together may be physically unrelated.

In some embodiments, the metering devices (e.g., IEDs) and equipment/loads of the above and below described systems and methods are installed, located and/or derived from different respective locations (i.e., a plurality of locations) or metering points in the electrical/power system. A particular IED (e.g., a second IED) may be upline (or upstream) from another IED (e.g., a third IED) in the electrical system while being downline (or downstream) from a further IED (e.g., a first IED) in the electrical/power system, for example.

It is understood that one or more features of the above discussed systems and methods may be combined with and/or replace one or other features of the above discussed systems and methods in some embodiments.

In one embodiment, the user may focus first on the "most frequently occurring" profiles. As stated earlier, the user may check that these profiles are non-impactful for the system (e.g., that there is no risk of damage, or any risk of higher costs, among other possible criteria). After analyzing these, the user then may remove all these "normal" profiles to focus on conducting a similar analysis on the "abnormal" profiles. The user may then refine the profile tagging, by tagging as "normal" any of the "abnormal" profiles which are non-impactful to the system. This allows the user to filter out the non-impactful profiles (all being tagged as "normal") and to focus on the impactful profiles/events or on any new profile/events (e.g., the section of a measurement/waveform).

It is also understood that there hopefully is a lot of "white noise of normalcy" in an end-user's data, meaning everything is (mostly) working properly and the energy source is acceptable. Because of this large amount of white noise of normalcy, locating/targeting the "abnormal" data may be more difficult/cumbersome. In one aspect, the claimed invention in co-pending U.S. application Ser. No. 14/966,720 requires the end-user to locate the "abnormal" data to characterize it. In this supplemental approach to tagging the data, the system discards (by marking as normal) all the "white noise of normalcy" so the end-user can focus on identifying, tagging, characterizing, etc. the abnormal data. In short, in accordance with embodiments of this disclosure, the supplemental approach provides better efficiency to the claimed invention in co-pending U.S. application Ser. No. 14/966,720.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
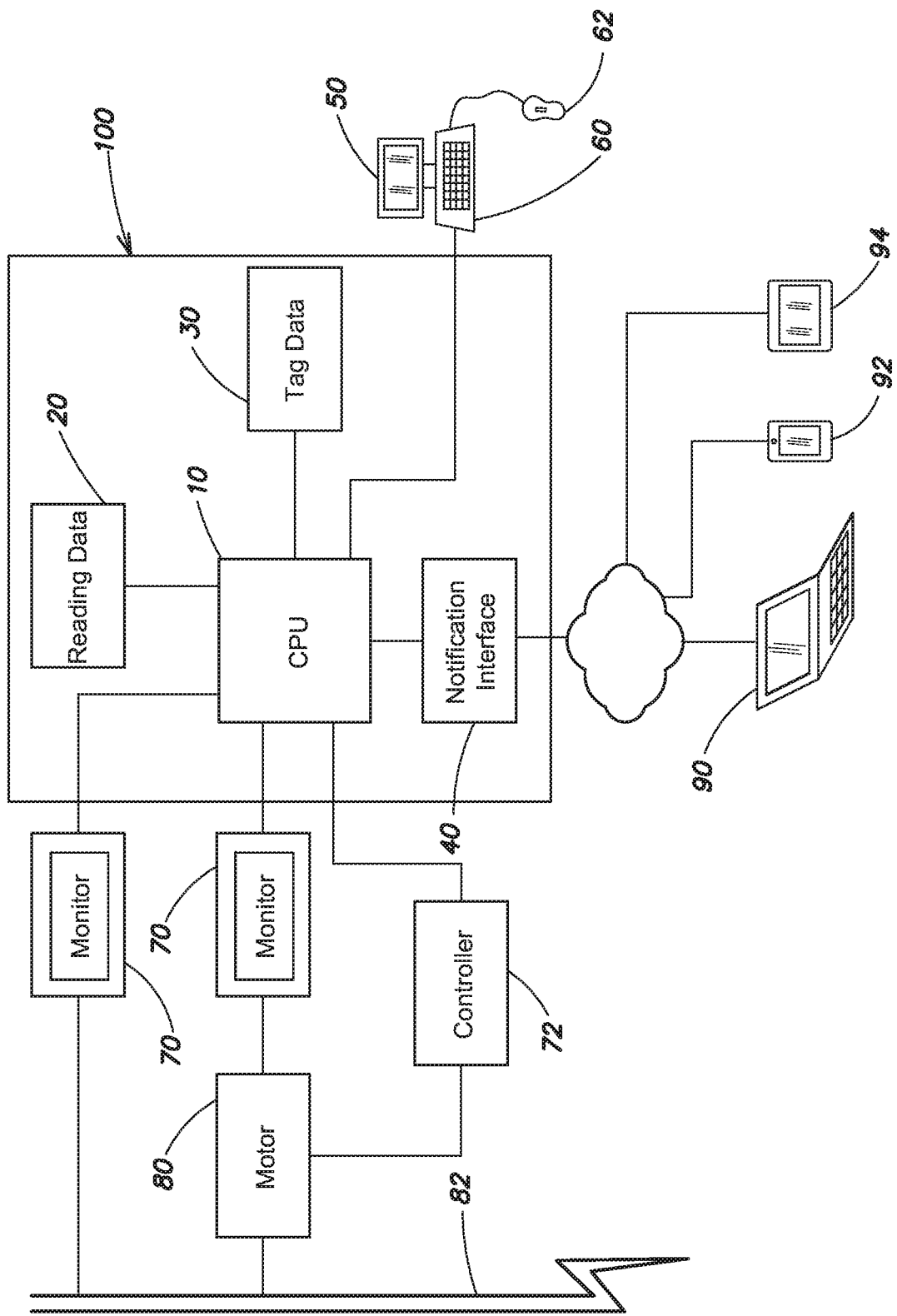
FIG. 1 is a schematic of an embodiment of a system for graphically displaying events in a power system.

This disclosure is not limited in its application to the details of construction and the arrangement of components set forth in the following description or illustrated in the drawings. The disclosed systems and methods are capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein is meant to encompass the items listed thereafter and equivalents thereof as well as additional items.

As discussed above, a fundamental drawback of current system using manual or automated setpoints is that they can be used to detect simply if a reading falls outside of an expected or normal range as defined by the user or system. Other aspects of the reading—such as the overall trend or "shape" of the readings, the length of time covered by the reading, the nature of the component being observed and the operations being performed on it at the time, and other contextual information are not taken into account. Various aspects and embodiments disclosed herein overcome that drawback by allowing a user to visually identify and classify an event. This allows the system to automatically identify characteristics of the event, so that a similar potential event can be identified in a second set of readings based on those characteristics.

Various aspects and embodiments disclosed herein include systems and methods for providing users the opportunity to visually classify events in an electrical system (e.g., an electrical distribution system). Aspects and embodiments disclosed herein include a central processing unit on a distributed system and a user interface for interacting with the central processing unit. Aspects and embodiments disclosed herein also include a monitor capable of observing and measurements about electrical or other aspects of an electrical system, to be stored and analyzed at a later time. A user (e.g., a system administrator, technician, or trainee) uses the user interface to graphically identify sets of readings corresponding to an event of a type that the user (or others) may wish to identify in future data, and to tag or label the event. The central processing unit determines a characteristic of the set of readings (i.e., event) identified by the user, such as the shape or trend of the readings observed during the event, and attempts to identify the same characteristic in a second set of readings and tag or label it appropriately with the tag.

An embodiment of a system for monitoring and tagging events in a power system is illustrated schematically, generally at 100, in FIG. 1. The system 100 includes at least one central processing unit (CPU) 10 for receiving performance characteristics of components of a power system. In the example of FIG. 1, monitors 70 measure some performance characteristics of motor 80 and/or transmission line 82. For example, the monitors 70 may measure voltage, current, resistance, power, load, impedance, or other electrical or performance characteristics of a power system or its components. Such components may include generators, transformers, power conditioners, inverters, buses, rectifiers, transmission lines, or other components not shown in FIG. 1. Readings taken by the monitors 70 may be stored in the system as reading data 20, which may be stored as a relational or non-relational database, text or flat file, delimited file, or other format for storing data as known in the art. Monitors may work in tandem to provide certain readings. For example, readings from a first monitor connected to a circuit inline before a component and a second monitor connected to the circuit inline after the component may be combined to determine a voltage drop across the component.

The system 100 provides at least one user interface 50, which may be displayed to a user via a user computer 60 having an input device 62 (e.g., a keyboard, mouse, trackball, touchscreen, or the like). The user interface 50 is configured to display the measurements in a graphical format, such as a time-series graph. For example, the measurements may be displayed in a voltage-over-time, current-over-time, resistance-over-time, or other format. The user interface 50 is further configured to receive a selection, by the user, of a portion of the measurements. The user interface may be configured to receive a graphical selection of a portion of the measurements. For example, the user may be provided the capability to draw a polygon (e.g., a rectangle) or free-hand selection around a portion of the measurements being displayed in the graph. The user interface 50 is also configured to receive a selection, by the user, of classifications (e.g., one or more tags or labels) to provide information about the portion of the measurements. For example, the user may be given the opportunity to type, click, or otherwise input the one or more tags into the user interface 50. In one example, the user may select a portion of voltage measurements occurring over a period of time and tag them with the "voltagespike" tag.

The one or more tags may be associated with the selected portion of the measurements and stored as tag data 30. The user interface 50 may provide additional functionality, such as searching for measurements from a particular time period to be displayed. The user interface 50 may also allow a user to "zoom" in and out in order to show measurements over a shorter or longer period of time, respectively.

The CPU 10 is further configured to determine one or more characteristics of the selected measurements, and to identify a second portion of measurements having at least one characteristic in common with the first portion of measurements. The system may then automatically apply the classification (e.g., tag) to the second portion of measurements. To continue the example above, the CPU 10 may examine the portion of voltage measurements tagged "voltagespike" and ascertain that the voltage measurements within the selected portion of measurements reflect an observed voltage range that, over a very short period of time, is higher than those in the surrounding portions. When a second portion of measurements is observed to have a voltage range that is similarly higher than those in the surrounding portions over a short period of time, that second portion of measurements can be automatically tagged "voltagespike" as well.

The system 100 further includes a controller 72 that is configured to control or perform an operation on some component or other aspect of the system. The controller 72 may act upon the system and/or component in response to a second portion of measurement being tagged. For example, the controller 72 may be coupled to a breaker and be configured to remove power from the component in the event of undesirable performance that may be a precursor to damage being done to the component and/or the system. As another example, the controller 72 may be coupled to a harmonic filter and be configured to control the harmonic filter in the event that undesirable harmonic content is detected.

The user interface 50 may allow a user to define a notification or other action to be taken in the event that another portion of measurements is tagged with the tag. For example, the user may be provided the option to receive a notification whenever the tag # voltagespike is automatically applied to a portion of measurements. A notification interface 40 may provide the notification that the tag has been applied to the second portion of measurements. For example, the notification may be sent by email, SMS, social media message, Twitter® Tweet, automated telephone call, row or record insertion in an event database, or other notification method. The user may receive the notification on one or more user devices 90, 92, 94.

Figure 2A:
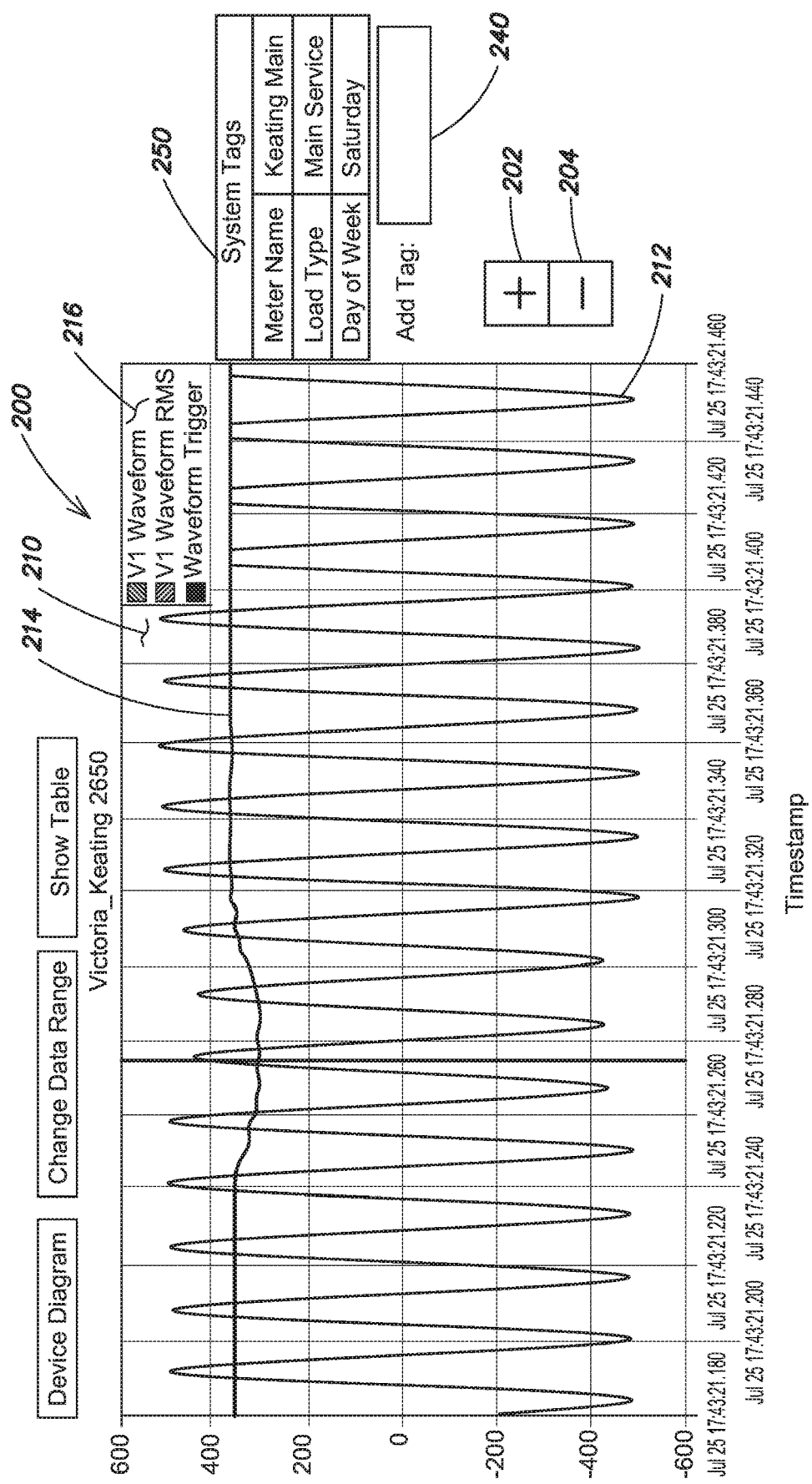
FIG. 2A is an example of a user interface.

An exemplary user interface 200 is shown in FIG. 2A. User interface 200 presents the user with a measurement window 210 graphically displaying measurements taken by one or monitors configured to monitor a power system. In FIG. 2, the measurement window 210 shows a time-series graph that depicts multiple series of voltage-related measurements over a particular timeframe. In particular, a voltage waveform series 212 and a voltage root-mean-square (RMS) waveform series 214 are shown, with time on the horizontal axis and voltage on the vertical axis. Of course, other measurements (e.g., current, resistance, or impedance) or functions thereof may be displayed in user interface 200 without departing from the spirit of the invention.

The user interface 200 include a series legend 216 for identifying which series are currently displayed and/or available to be displayed in measurement window 210. In some embodiments, series legend 216 may provide the user with the capability of adding, removing, or otherwise modifying the displayed series in the measurement window 210. For example, the user may be given the option to switch the type of series (e.g., from voltage to current) displayed in the measurement window 210. The user may further have the ability to add or overlay statistical functions of a series, such as the RMS waveform series 214 shown in FIG. 2, which depicts the root mean square of the voltage waveform series 214.

The user interface 200 further includes controls for adjusting the portion of the series visible in the measurement window 210. For example, controls 202 and 204 allow a user to zoom in on a particular time period or portion of a series, or to zoom out to encompass a longer time period or an additional portion of the series. In some embodiments, controls may be provided to allow zooming in and out along specific axes. For example, time (horizontal axis) zoom controls may allow the user to choose to see a longer or shorter time period. Measurement (vertical axis) zoom controls may allow the user to zoom in on a particular portion of a measurement, such as the upper peak of the waveforms.

The user interface 200 further includes a tag input region 240 allowing a user to enter a tag to be associated with a portion of a series. A text input box is shown, which may provide auto-complete functionality or other suggestions of existing or intuited tags. Other methods of applying a tag may be employed, such as clicking on a displayed tag to be associated with a portion of series, or dragging and dropping a displayed tag onto the portion of the series with which it is to be associated.

The user interface 200 further includes one or more tag legends 250 that display information about how the system or one or more users have tagged the displayed series or portions thereof. As discussed in more detail herein, a tag may be applied to some portions or all of a series. In some embodiments, tags may indicate how/where the measurements were taken. Tags may also indicate a load type (e.g., main or auxiliary service), and may indicate a day of week, part of week (e.g., weekday or weekend), time of day (e.g., 10:00 am), characterization of time of day (e.g., peak or non-peak), or other indications regarding the series and what it represents. For example, tag legend 250 reflects system-generated tags indicating that "Meter Name" is "Keating Main," that the Load Type is "Main Service," and that the Day of Week is "Saturday."

Figure 2B:
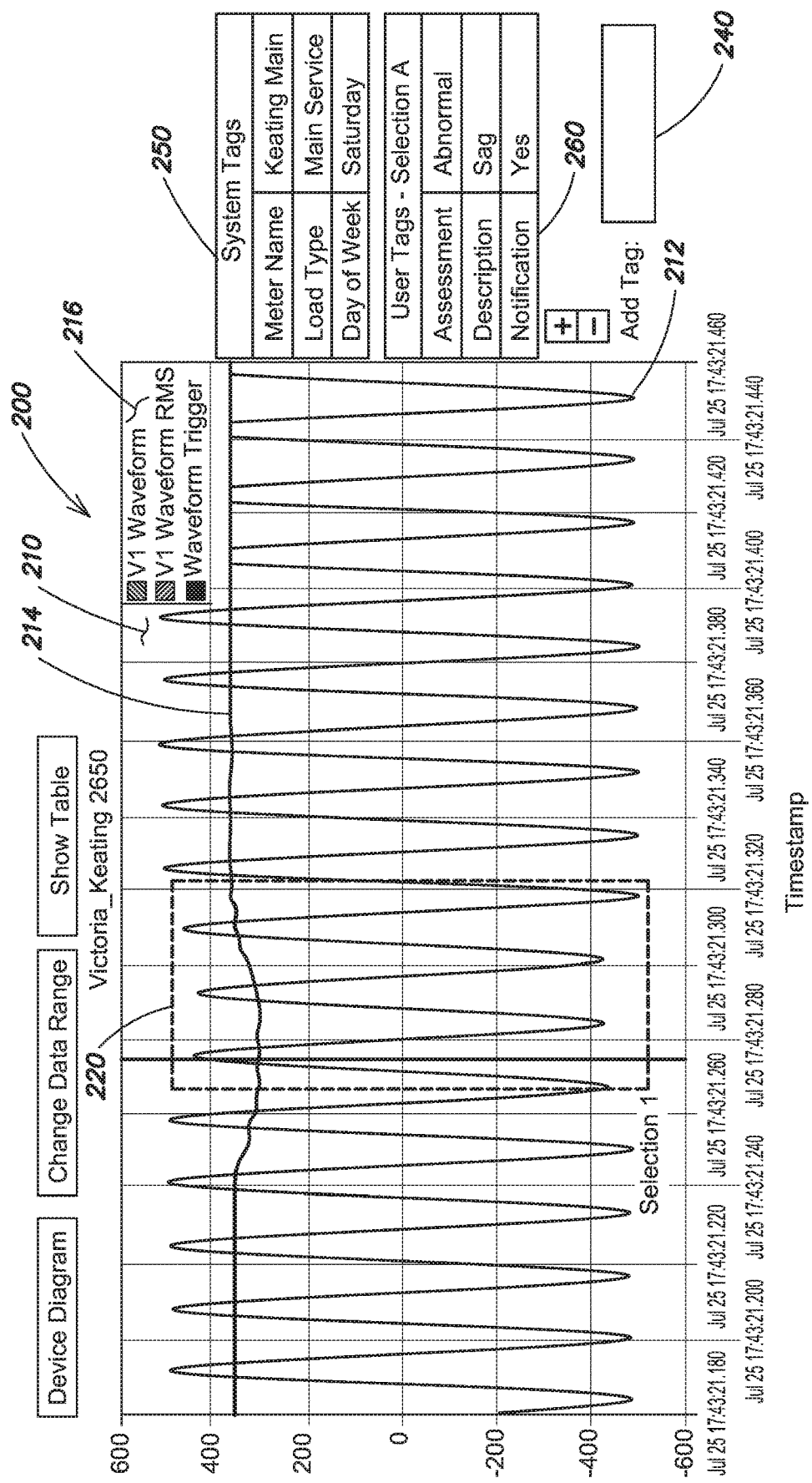
FIG. 2B is an example of a user interface.

FIG. 2B shows the user interface 200 in which a user selection 220 of a portion of the measurement window 210 has been made. The user selection 220 reflects that the user has characterized, or wishes to characterize, some aspect of those measurements displayed within the user selection 220. In this embodiment, the user selection 220 is made by the user drawing a rectangle within the measurement window 210 with an input device such as a mouse, trackball, trackpad, touch screen, or other such interface. Other methods of making the user selection 220 may be possible, including entering coordinates for a polygon representing the user selection 220. In some embodiments, the system may be configurable to automatically adjust user selection 220, for example, by "snapping" the edges of the polygon to a location that the system has determined may be desired by the user. For example, the right edge of the user selection 220 shown in FIG. 2B passes through the middle of an upward curving part of the series, which may have been an arbitrary or unintentional act by the user; the system may be configured to automatically adjust the user selection 220 to pass through a trough, peak, or other feature of the curve.

The user interface 200 in FIG. 2B displays an additional tag legend 260 corresponding to user-created tags that provide information about the measurements within user selection 220. As tag legend 260 shows, user selection 220 (referred to as "Selection A") has been tagged by a user with an Assessment of "Abnormal" and an associated Description is "Sag," meaning that the user has tagged user selection 220 as indicative of an abnormal voltage sag condition. Tag legend 260 further indicates that Notification is set to "Yes," indicating that the user and/or others should receive a notification in the event that the condition is identified in the future. The user interface 200 may also allow the user to activate or select user selection 220 by clicking on the associated tag legend 260, or vice versa.

Figure 3:
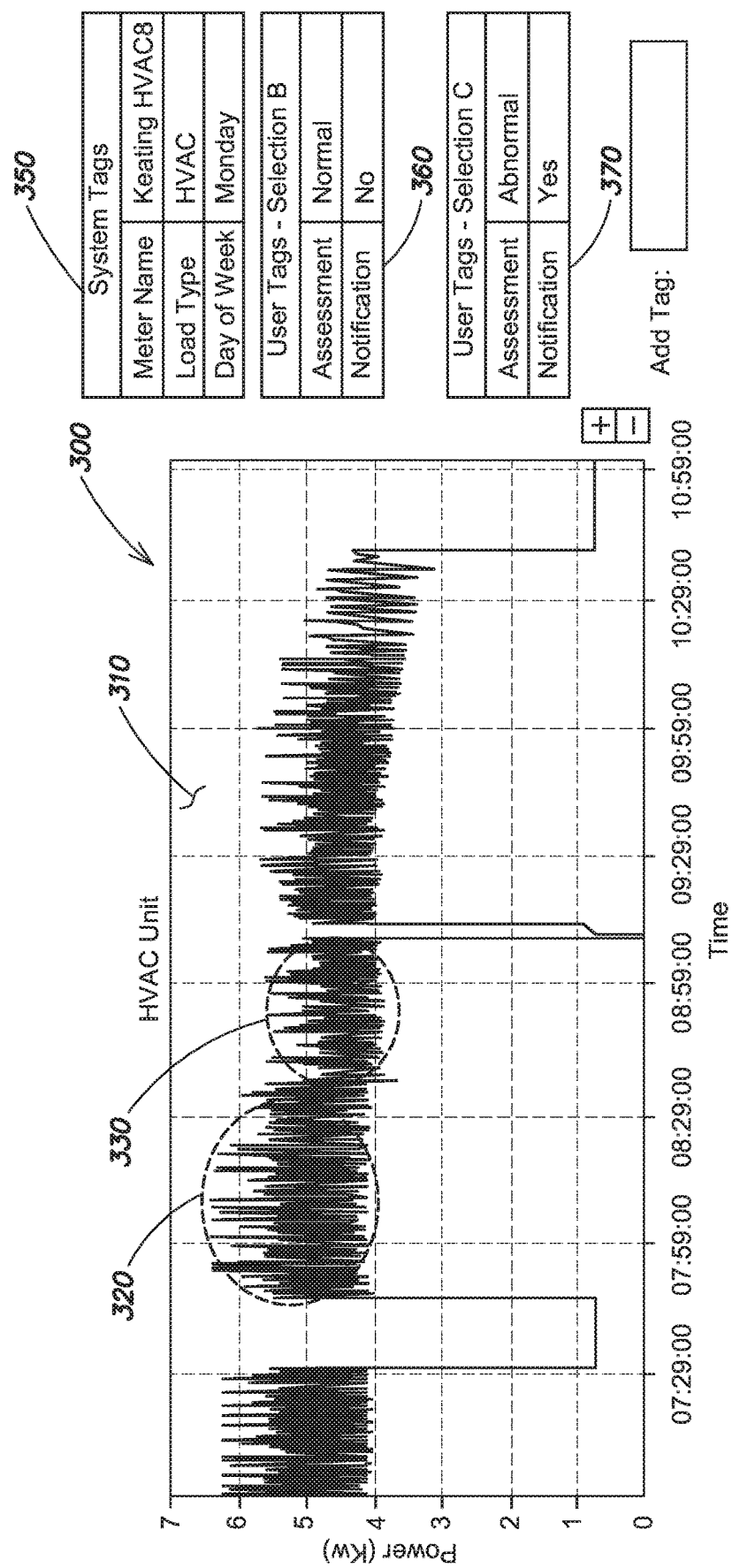
FIG. 3 is an example of a user interface.

It will be appreciated that the user selection 220 may be other than a rectangle, i.e., it may be a different polygon or other shape. The user interface 300 in FIG. 3 shows multiple oval user selections 320 and 330, corresponding to multiple different measurements from a series in the measurement window 310 that the user wishes to select. Tag legend 350 reflects system tags for the series of measurement data, indicating that "Meter Name" is "Keating HVAC8," that the Load Type is "HVAC," and that the Day of Week is "Monday." Tag legend 360 reflects user tags for the portion of measurements referred to as "Selection B," indicating that Assessment is "Normal" and Notification is "No." These tags may indicate to the system that the measurements reflect normal operation, and that notifications need not be sent when a similar set of measurements is observed in the future. Tag legend 370 reflects user tags for the portion of measurements referred to as "Selection C," indicating that Assessment is "Abnormal" and Notification is "Yes." This tag may indicate to the system that the measurements reflect abnormal operation, and that notifications should be sent when a similar set of measurements is observed in the future.

Figure 4:
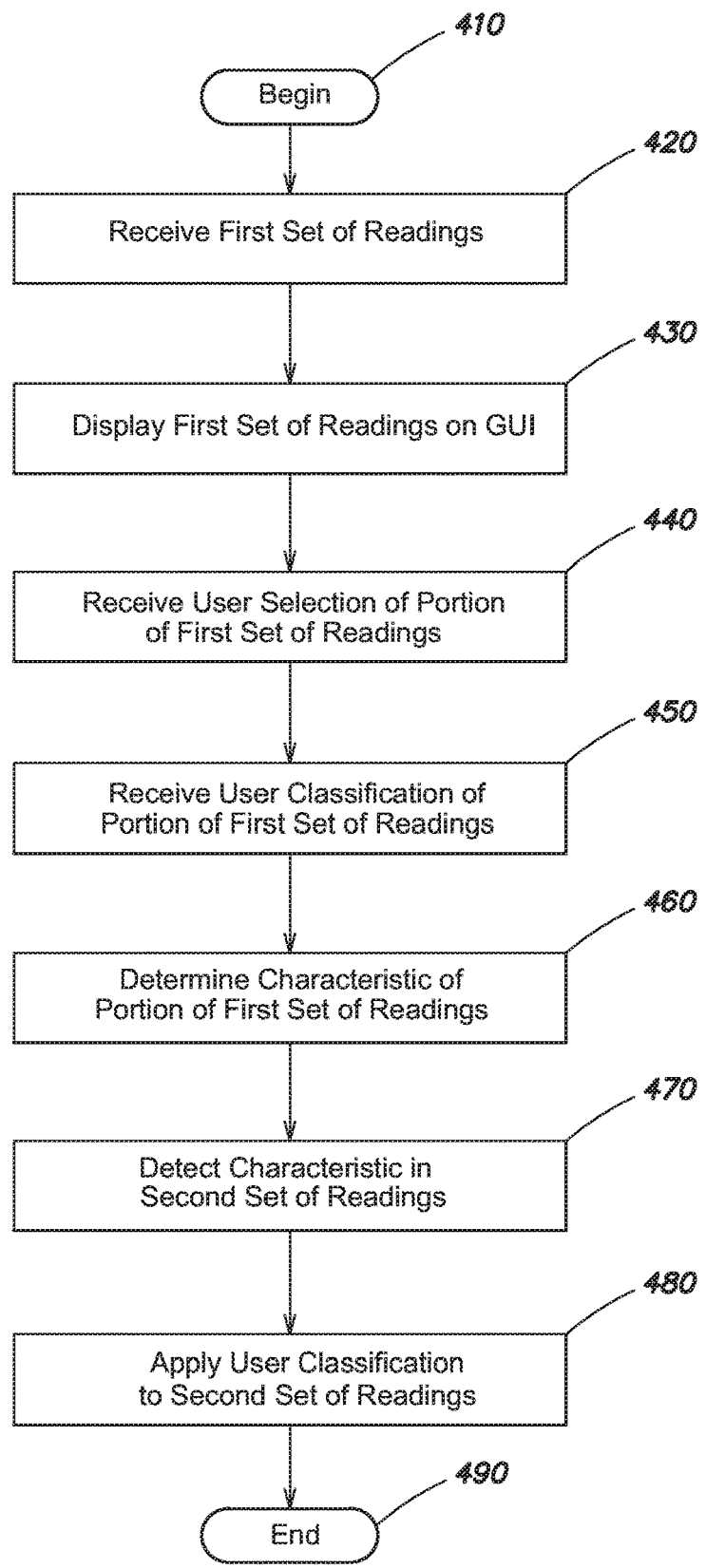
FIG. 4 is a flowchart of an example method of applying tags to readings of events in a power system, for example, when monitoring the power system.

An embodiment of a method for visual tagging of events, for example, for monitoring a power system, is illustrated generally at 400 in FIG. 4, for example.

Referring to FIG. 4 and FIGS. 4B-4D and FIG. 5, several flowcharts (or flow diagrams) are shown to illustrate various methods of the disclosure. Rectangular elements (typified by element 410 in FIG. 4), as may be referred to herein as "processing blocks," may represent computer software and/or algorithm instructions or groups of instructions. Diamond shaped elements (typified by element 1455 in FIG. 4B), as may be referred to herein as "decision blocks," represent computer software and/or algorithm instructions, or groups of instructions, which affect the execution of the computer software and/or algorithm instructions represented by the processing blocks. The processing blocks and decision blocks (and other blocks shown) can represent blocks performed by functionally equivalent circuits such as a digital signal processor circuit or an application specific integrated circuit (ASIC).

Figure 5:
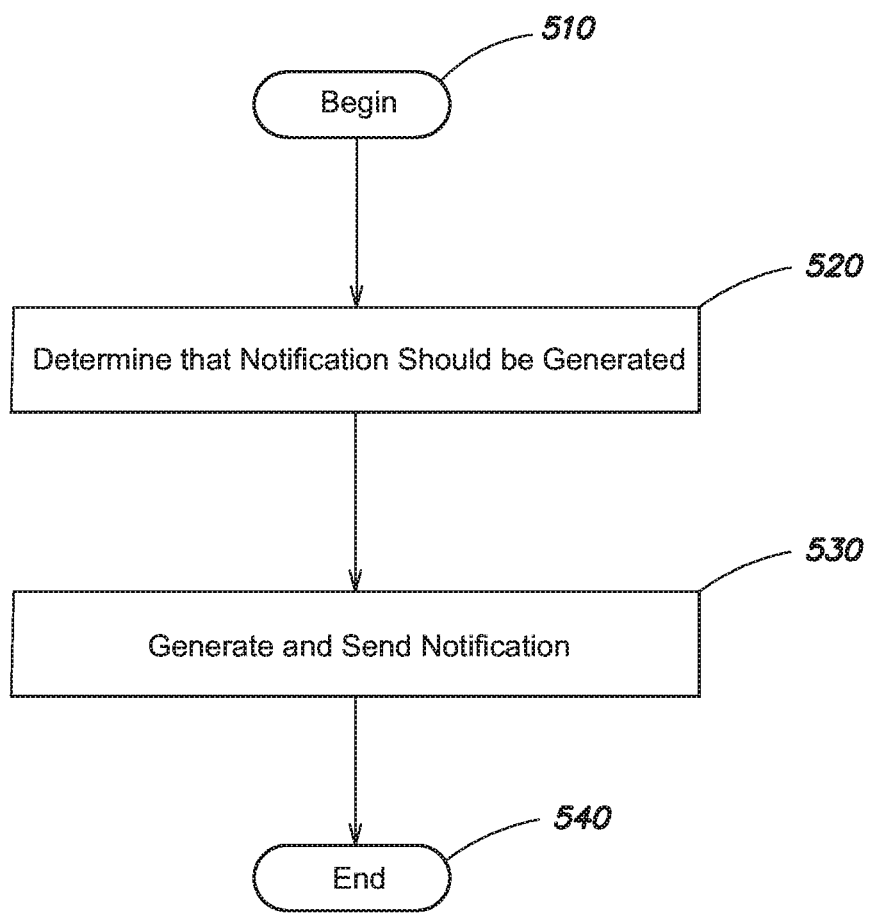
FIG. 5 is a flowchart of a method of sending notifications in response to events in a power system being tagged.

The flowcharts do not depict the syntax of any particular programming language. Rather, the flowcharts illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied. Thus, unless otherwise stated, the blocks described below are unordered; meaning that, when possible, the blocks can be performed in any convenient or desirable order including that sequential blocks can be performed simultaneously and vice versa. It will also be understood that various features from the flowcharts described below may be combined in some embodiments. Thus, unless otherwise stated, features from one of the flowcharts described below may be combined with features of other ones of the flowcharts described below, for example, to capture the various advantages and aspects of systems and methods associated with the concepts, systems, circuits and techniques sought to be protected by this disclosure. It is also understood that various features from the flowcharts described below may be separated in some embodiments. For example, while the flowcharts illustrated in FIGS. 4-5 are shown having many blocks, in some embodiments the illustrated method shown by these flowcharts may include fewer blocks or blocks.

Referring now to FIG. 4, at block 410, the method 400, which may correspond to a method for monitoring a power system, begins.

At block 420, a first set of readings is received. The readings are received, directly or indirectly, from one or more monitors (e.g., monitors 70), and stored in a suitable memory or on-disk storage (e.g., reading data 20). Readings may include measurements taken regarding the voltage, current, resistance, power, load, impedance, or other electrical or performance characteristics associated with a power system or its components. Such components may include generators, transformers, power conditioners, inverters, buses, rectifiers, or transmission lines.

Readings are taken at intervals. In some embodiments, readings may be taken at regular intervals, such as every hundredth of a second, tenth of a second, second, or multiple thereof. In some embodiments, the system is configured to take more frequent readings in response to a previous or ongoing issue with the component, or at the user's instruction to do so.

In one embodiment, upon detection of an potentially interesting event, readings are stored at least until the end of the event is detected; otherwise, a relatively short historical record of readings may be preserved in order to minimize costs associated with storage and processing. In either case, historical readings no longer of use to the system may be retained, moved to external long-term storage, or may be deleted from the system.

Reading values themselves may be stored (e.g., as reading data 20) as the raw reading value received from the monitor, or may be modified or adjusted. Mathematical operations may be performed on readings from multiple monitors and the result stored. For example, readings from a first monitor connected to a circuit after a component may be subtracted from readings from a second monitor connected to the circuit before the component to determine a voltage drop across the component. Additional information is also stored with the reading values. For example, the datetime stamp associated with the reading (i.e., the time the reading was taken) may be stored. In some embodiments, more than one reading may be stored in a tabular format for a particular datetime. For example, the voltage, current, and internal resistance for a particular component may be stored at each interval. In other embodiments, different types of readings may be stored in different locations (e.g., separate tables).

In one embodiment, the system associates the first set of readings (or portions thereof) with one or more systems tags or other textual or graphical labels that classify some aspect of the first set of readings or their context. For example, system tags may be applied that identify the component, system, subsystem, datetime, load type, event type, or other characteristic known to the system regarding the first set of readings or the circumstances in which they were taken.

At block 430, the first set of readings is displayed on a graphical user interface, for example, user interface 50, or the user interfaces 200, 300 shown in FIGS. 2A, 2B, and 3. In a preferred embodiment, as discussed above with respect to FIGS. 2A, 2B, and 3, the user interface displays one or more series of measurements on a time-series graph, with the measurement (e.g., voltage) shown as a line varying along the vertical axis over a period of time (horizontal axis). In some embodiments, multiple series may be depicted, such as in different line types (e.g., broken, solid, or dashed) or in different colors. Controls may be provided to allow a user of the interface to toggle individual series so that they are visible or invisible. Series may further be selectably highlighted or otherwise activated so that a particular series of interest to the user can be emphasized. Selecting a series in such a way may cause the display or visual emphasis of a related vertical axis appropriate for displaying data in the series.

In a preferred embodiment, the first set of readings may represent an event automatically identified by the system as a candidate for tagging in later blocks. For example, the system may determine that a particular set of the readings reflects a low average voltage over a period of time, and may present that set of readings to the user as the first set of readings.

As discussed above with respect to FIG. 2, controls may be provided to allow the user to zoom in or out of the data on one or more axes. For example, the user may be provided the option to show the series over a longer or shorter period of time, and may be provided the option to show a wider range of values along the vertical axis. In some embodiments, activating or hovering over a data point (e.g., with a mouse) on the displayed series may cause the underlying measurement to be displayed in proximity to the data point.

In another embodiment, the first set of readings may be displayed (or the option may be provided for the first set of readings to be displayed) in a table or other numerical format in which the measurements themselves are displayed.

In addition to displaying the first set of readings, the graphical user interface may also display user- or system-determined functions of the first set of readings, or other data derived from the first set of readings. For example, a graphical user interface displaying a voltage reading over time may also display the root-mean-square voltage. The graphical user interface may also be configured to display known calculated values when the values needed to perform the calculation are displayed and/or available. For example, if a series of measurements representing a current of a component is available, and a series of measurements representing a voltage of the component for the same time period is available, the graphical user interface may be configured to display the instantaneous electrical power (P) derived by the calculation $P(t)=I(t) \cdot V(t)$. Such derived calculations may be automatically displayed, or may be provided or suggested as an option to the user through the user interface.

At block 440, a user selection of a portion of the first set of readings is received. In a preferred embodiment, the user of the user interface is provided a user input device, such as a mouse, trackball, stylus, or other input device or component. The user then selects a portion of the first set of readings by clicking and dragging a polygon or other shape (e.g., circle or freehand line) around the portion of the first set of readings. In another embodiment, the user selects the portion of the first set of readings by clicking within the user interface at points above the x-axis corresponding to the start time and end time of the desired portion of the first set of readings. In still other embodiments, the user may be prompted to type in coordinates identifying which portion of the first set of readings is to be selected, or otherwise prompted to enter or select a start time and an end time.

In embodiments where the first set of readings is displayed in a table or other numerical format, the user selected of the portion of the first set of readings may be received by the user highlighting or otherwise selecting the data (e.g., the rows of the table) corresponding to the desired portion of the first set of readings.

At block 450, a classification of the portion of the first set of readings is received. In a preferred embodiment, the user associates the portion of the first set of readings with one or more tags or other textual or graphical labels that classify some aspect of the first set of readings, their context, or a desired action to be taken when a similar set of readings is encountered in the future. The user is provided the opportunity to type custom tags, or may be provided with a list of existing tags from which to choose. In one embodiment, the system may suggest appropriate tags based on rules, criteria, previously-tagged readings, or other information.

In a preferred embodiment, a tag is associated with an attribute, with the tag providing a value or other input for the attribute. For example, the system may provide for the user to enter a source tag, which identifies the component, system, or subsystem to which the readings relate. The user may also provide a load tag identifying the type of load associated with the reading data. The user may also provide a time period tag identifying a day of week, day of month, week of month, day or month of year, or other distinguishing information about the time in which the reading was taken, such as whether it was a weekend or a peak usage period. The user may also provide a context tag, which may include information relevant to interpreting the reading data and identifying similar future readings. For example, the user may provide a context tag of "heatwave" to indicate that the current weather conditions are such that users are likely using air conditioning (and therefore drawing power from the system) at a higher rate than usual. The user may also provide an event tag, which may include information explaining or characterizing a system operation, function, or condition occurring during the time the readings were taken. For example, an event tag of "startup" may indicate that a motor component is in the transient state of starting up, which may explain variations from expected normal operation. The user may also provide a diagnosis tag, which may include information diagnosing an underlying reason for deviations in the reading data from their expected values. For example, a diagnosis tag of "voltage-sag" may indicate that the reading data reflects a period during which voltage sag was experienced. As another example, a diagnosis tag of "harmonic-content" may indicate that the reading data reflects a period during which harmonic content is experienced in the system. Harmonic content is an undesirable phenomenon in multi-phase systems, and can negatively affect power quality of the system.

It is understood that other types of power quality issues/events may also negatively affect the reliability and voltage quality of the system. For example, a voltage sag, a voltage swell, a voltage transient, an instantaneous interruption, a momentary interruption, a temporary interruption, waveform distortion, power frequency variation, imbalance, and a long-duration root-mean-square (rms) variation are examples of power quality issues that may negatively affect the reliability and voltage quality of the system.

In accordance with embodiments of this disclosure, the user may also provide an assessment tag, which may indicate a conclusion relating to the diagnosis or other characterization of the reading data. For example, an assessment tag of "abnormal" may be provided. The user may also provide a notification tag, which may indicate whether notifications should be sent to draw attention to a recent, ongoing, or recurring issue identified in the reading data. The user may also provide an action tag, which may include instructions that the system should initiate automatically in response to a detected system operation, function, or condition of the power system or a component thereof. In some embodiments, the system may automatically take or suggest certain actions in response to a second set of readings being tagged, regardless of whether an action tag has been specified. For example, where the second set of readings indicates that system failure, or damage to the system, is imminent, a breaker may be tripped to disable the affected component or reroute current around the component to avoid an outage.

Additional tagging features and functionality may be provided, such as tags having predefined values or meanings that are recognized by the system. For example, a characterization tag may be expected or requested from the user with the assigned value having a meaning to the system. Assigning the characterization tag a value of "too-low" may be recognized by the system as providing an upper boundary by which lower readings can in the future be automatically tagged as "too-low" as well. Similarly, assigning a characterization tag of "average" may be compared with other "average" characterization tags to determine a band of readings that may be considered and tagged as "average."

The user may be allowed to create, with some limitations, user-specific tags as desired, and tags may have no inherent meaning beyond the association created between a tag and a portion of the first set of readings. Rules may be enforced to distinguish between system- and user-created tags, and tags may be displayed differently depending on whether they were created by the system or user. For example, system-created tags may be all lowercase, whereas user-created tags may be required to start with an upper-case letter. System- and user-created tags may be displayed in different colors, font sizes, or otherwise visually differentiated, as well.

At block 460, one or more characteristics of the portion of the first set of readings are determined, for example, by CPU 10. In one embodiment, it is determined that the portion of the first set of readings differs from neighboring portions of the first set of readings in some way. For example, the portion of the first set of readings may result in an average reading (e.g., average voltage) that exceeds a threshold average voltage by some threshold. The threshold average voltage may be determined by user input, reference to other readings from the first set of readings, reference to other readings from comparable time periods, or reference to other information. As another example, the first set of readings may be determined to include readings that exceed a threshold. In one embodiment, a regression model may be determined from the first set of readings, and the resulting model or function stored. A set of data points occurring at standardized intervals may be generated from the resulting model, so that comparison can later be made with other readings similarly standardized from readings taken at a different frequency.

In one embodiment, a characteristic of the portion of the first set of readings may be determined with reference to other subsystem or components whose operation may have an effect on the subsystem or component to which the first set of readings relate. For example, the system may review logs or schedules to determine what conditions or events may have preceded an event tagged in the portion of the first set of readings. For example, the system may detect that, according to a schedule or other instruction to do so, a number of motors in the system started simultaneously immediately before a voltage sag occurred. This coordinated startup may be identified by the system as a characteristic of the portion of the first set of readings in which the voltage sag is reflected.

In one embodiment, a characteristic of the portion of the first set of readings may be determined independently of the time period represented in the portion of the first set of readings. That is, a shape, profile, or other aspect of the portion of the first set of readings may be identified so that it can later be compared with another set of readings that, while occurring over a different length period of time, may nonetheless share the characteristic.

The one or more characteristics of the portion of the first set of readings are stored for later comparison with other sets of readings. The entire portion of the first set of readings may be stored, or a regression model or fitted data points generated therefrom may be stored. In one example, the maximum, minimum, mean, or standard deviation of reading(s) in the portion of the first set of readings may be stored. In another example, the deviation of the readings from an expected, average, or determined threshold reading may be stored.

At block 470, the one or more characteristics are detected in a second set of readings. The one or more characteristics are detected by evaluating how the second set of readings relates to the readings, criteria, threshold, or model determined with respect to one or more readings previously tagged by the system or users. For example, if the maximum, minimum, mean, or standard deviation of reading(s) in the portion of the first set of readings is stored, the maximum, minimum, mean, or standard deviation of readings in the second set of readings may be compared to those of the portion of the first set of readings in order to determine if a sufficient correlation or any other similarity(s) or dis-similarity(s) exists. As another example, and discussed above, a regression model may be determined from the second set of readings, and the resulting model or function, may be compared to the portion of the first set of readings. A set of data points occurring at standardized intervals may be generated from the resulting model, so that comparison can be made with the characteristics of the portion of the first set of readings, to determine if a correlation or any other similarity(s) or dis-similarity(s) exists.

A comparison to a portion of a first set of readings having a defined tag may also be performed. For example, a determination that a second set of readings is higher than a portion of a first set of readings tagged "too-high" may cause the second set of readings to be tagged "too-high" as well.

It will be appreciated that while the examples given here refer to a comparison with a portion of the first set of readings for simplicity of illustration, it is possible and desirable to compare the second set of readings to any number of available previously-tagged readings in order to best tag the second set of readings. A larger set of previously-tagged readings allows for greater refinement of the thresholds and criteria according to which classifications are applied to later readings. For example, the system may use a set of readings previously tagged as "too-low" to determine the upper threshold of what constitutes a reading that should be tagged as "too-low" in the future.

In one embodiment, the one or more characteristics are detected in a second set of readings by comparison to the portion of the first set of readings without regard to the time period covered by either set of readings. Where a second set of readings may have a characteristic of the portion of the first set of readings, a commonality may be determined even where, for example, the portion of the first set of readings spans less than 5 minutes, and the second set of readings covers a time period of 2 hours. The minimum, maximum, mean, overall trend, shape, progression, or outcome of the two sets of readings may be compared to determine if there is a correlation or any other similarity(s) or dis-similarity(s). Such a correlation or any other similarity or dis-similarity(s) may be found through dynamic time warping (DTW) algorithms, shape matching, or other techniques known in the art.

At block 480, the classification is applied to the second set of readings. System- and/or user-created tags associated with the portion of the first set of readings are associated with (i.e., applied to) the second set of readings. For example, if a portion of the first set of readings was tagged with the "voltage-sag" tag at block 450, and the second set of readings is determined at block 470 to share a characteristic of the portion of the first set of readings such that there is sufficient correlation or any other similarity(s) or dis-similarity(s) between the two, then the second set of readings is also tagged with the "voltage-sag" tag.

Tags may be associated with the second set of readings based on other tags applied to the second set of readings. To continue the previous example, if the portion of the first set of readings has been tagged "voltage-sag," and the portion of the first set of readings has also been tagged "abnormal," then the second set of readings may be tagged "abnormal" as well. In another example, if a portion of the first set of readings from a motor component has been tagged "power-spike" and "startup" (indicating that the portion of the first set of readings corresponds to an expected power spike experienced during startup of a motor), and has also been tagged "normal," then the application of the "power-spike" and "startup" tags to the second set of readings may cause the "normal" tag to be applied to the second set of readings as well.

In general, additional tags may be applied to a set of readings by applying logic to a set of previous tags already applied to the set of readings, with a high degree of logical complexity provided for. In another example, if a portion of a first set of power readings from a motor component has been tagged "too-high" and "abnormal," and a second set of readings from the same component has some of the same characteristics, the presence of a "startup" tag applied to the second set of readings (indicating that the motor is in a startup phase) may cause the system to recognize that a power spike at startup is normal, and tag the second set of readings as "normal."

Figure 4A:
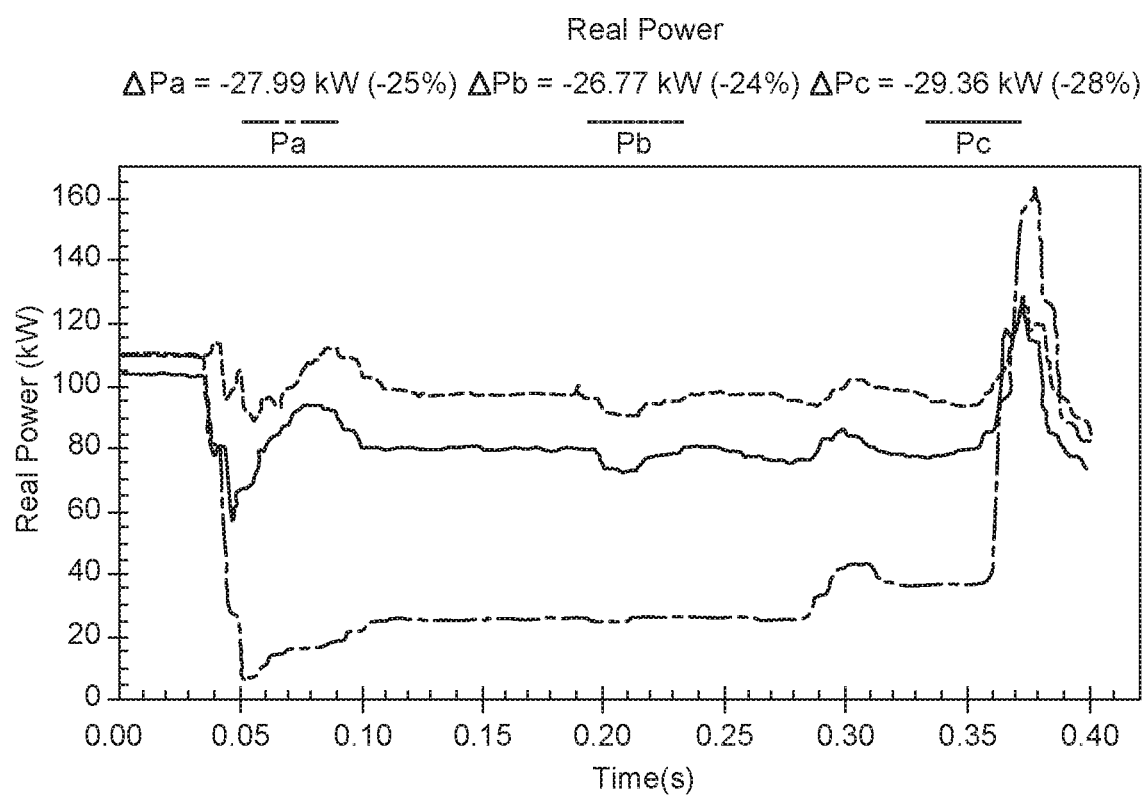
FIG. 4A shows an example root mean square (rms) real power waveform of a voltage sag event resulting in a load/equipment restart.

With further reference to motors, as a non-limiting example, standard (across the line) motor starts typically produce voltage sags due to the impedance between the source and motor and the motor's inrush current, which is typically 6-10 times the full-load current rating. The rms shape associated with a voltage event may be evaluated to indicate a load (e.g., a motor) starting, as illustrated in FIG. 4A. For example, inductive load currents and powers exhibit a significant positive impulse followed by an exponential decay rate (as the magnetizing field of the load is energized). Referring briefly to FIG. 4A, this figure illustrates the rms real power associated with an impactful voltage sag event on a real customer site. In this case, the voltage sag lasts for approximately one-third of a second. At the end of the voltage sag event, an undetermined load attempts to restart as indicated by the impulsive characteristics of the rms real power on the right side of the graph. This load restart may have been intentional or unintentional; however, the stress experienced by the load is pertinent in either case. If the load is a compressor motor, it may be important to defer restarting/re-energizing for a longer period of time to allow the system to equalize before attempting to restart. Alternatively, if the load is related to an extrusion process, it may be important to identify the need to provide ride-through capabilities on the motor controls to keep the motor running. In both cases, tracking these types of unscheduled restarts (and the time between running, stopping, and restarting) may be an important aspect in predicting the longevity of equipment. It is understood the loads (e.g., motors) may be different sizes and have various response characteristics. For example, larger loads may be much more sensitive to relays tripping (e.g., due to voltage sags) than smaller loads.

Returning now to block 480 of method 400, after the tags have been applied to the second set of readings, the second set of readings and the associated tags may be displayed via a user interface (e.g., user interface 50). The tags may be visually displayed to convey additional information. For example, a confidence level may be determined reflective of the system's confidence in applying a particular tag to the second set of readings, and the tag may be displayed at a brightness varying according to the confidence level.

At block 490, method 400 ends.

The functionality described herein can be employed on systems having multiple users. For example, the system may characterize a second set of readings by comparing them to multiple previous readings tagged by different users. In some situations involving multiple users, it may be expected that tags may conflict or otherwise be incompatible. For example, one user may tag a set of readings as "abnormal" and "too-high," whereas another user may tag the same set of readings as "normal" and "average." The system may later identify a characteristic of those earlier sets of readings in a second set of readings, and, in attempting to apply the tags associated with those earlier readings, may determine that the tags are in conflict. To continue the example, the system may determine that "normal" and "abnormal" tags are in conflict.

Conflict resolution among tags may be performed in any number of ways. In one example, the system may preserve and identify each individual's tags, such as by tagging the second set of readings both "@johndoe-normal" and "@bobsmith-abnormal." In another example, the system may resolve the conflict by applying a tag provided by a majority of users.

Figure 4B:
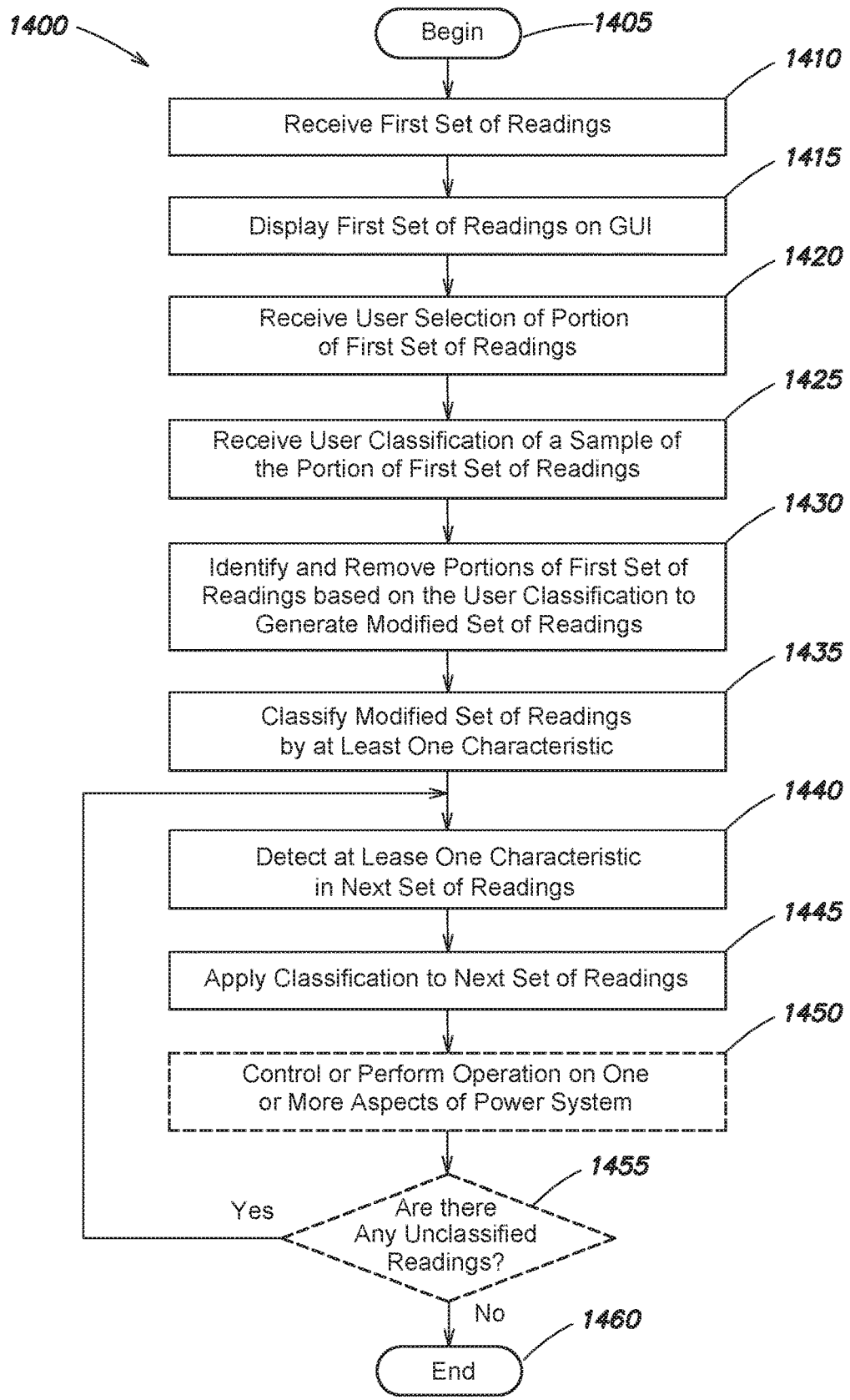
FIG. 4B is a flowchart of another example method of applying tags to readings of events in a power system, for example, when monitoring the power system.

Another example embodiment of a method for visual tagging of events, for example, for monitoring a power system, is illustrated generally at 1400 in FIG. 4B.

At block 1405, the method begins.

At block 1410, a first set of readings is received, for example, at an input of a CPU (e.g., CPU 10, shown in FIG. 1) in the power system. The readings may be received, for example, directly or indirectly, from one or more monitors (e.g., monitors 70, shown in FIG. 1), and stored in a suitable memory or on-disk storage (e.g., reading data 20). Readings may include measurements taken regarding the voltage, current, resistance, power, frequency, load, impedance, or other electrical or performance characteristics associated with a power system or its components which the monitors are in communication with. Such components may include generators, transformers, power conditioners, inverters, buses, rectifiers, or transmission lines, and/or any other type of load and/or electrical apparatus for example.

In some embodiments, readings are taken at intervals. The readings may be taken at regular intervals, such as every hundredth of a second, tenth of a second, second, or a multiple thereof, for example. In some embodiments, the system is configured to take more frequent readings in response to a previous or ongoing issue with the component, or at the user's instruction to do so.

In one embodiment, upon detection of a potentially interesting event, readings (which may include "normal" data or "normal with abnormal" data) are stored at least until the end of the event is detected; otherwise, a relatively short historical record of readings may be preserved in order to minimize costs associated with storage and processing. In either case, historical readings no longer of use to the system may be retained, moved to external long-term storage, or may be deleted from the system.

Reading values themselves may be stored (e.g., as reading data 20) as the raw reading value received from the monitor, or may be modified or adjusted. Mathematical operations may be performed on readings from multiple monitors and the result stored. For example, readings from a first monitor connected to a circuit after a component may be subtracted from readings from a second monitor connected to the circuit before the component to determine a voltage drop across the component. Additional information is also stored with the reading values. For example, the datetime stamp associated with the reading (i.e., the time the reading was taken) may be stored. In some embodiments, more than one reading may be stored in a tabular format for a particular datetime. For example, the voltage, current, and impedance for a particular component may be stored at each interval. In other embodiments, different types of readings may be stored in different locations (e.g., separate tables).

In one embodiment, the system associates the first set of readings (or portions thereof) with one or more systems tags or other textual or graphical labels that classify some aspect of the first set of readings or their context. For example, system tags may be applied that identify the component, system, subsystem, datetime, load type, event type, or other characteristic known to the system regarding the first set of readings or the circumstances in which they were taken.

At block 1415, the first set of readings (e.g., "normal" data or "normal with abnormal" data) is displayed on a graphical user interface, for example, user interface 50, or the user interfaces 200, 300 shown in FIGS. 2A, 2B, and 3. An example of "normal with abnormal" data, for example, is a waveform capture of a voltage sag event. Metering devices by Schneider Electric, for example, are often configured to capture some number of cycles preceding a voltage sag event (deemed as normal), the voltage event itself, and (if there's space available) the post-event data.

In one embodiment, as discussed above with respect to FIGS. 2A, 2B, 3 and 4, for example, the user interface displays one or more series of measurements on a time-series graph, with the measurement (e.g., voltage) shown as a line varying along the vertical axis over a period of time (horizontal axis). In some embodiments, multiple series may be depicted, such as in different line types (e.g., broken, solid, or dashed) or in different colors. Controls may be provided to allow a user of the interface to toggle individual series so that they are visible or invisible. Series may further be selectably highlighted or otherwise activated so that a particular series of interest to the user can be emphasized. Selecting a series in such a way may cause the display or visual emphasis of a related vertical axis appropriate for displaying data in the series. It is understood that the interface may display the measurements in one or more additional or alternative forms in some embodiments, for example, in the form of JPEG or PNG image(s). Data may also be displayed as taken from spreadsheets, databases, images, or other applications including custom applications. For example, time-series data may be taken from a spreadsheet file type (e.g., xlsx), csv, comtrade file, json file, or other comparable current and/or future file type that is ordered chronologically. Data may be displayed in a dynamic graphical environment e.g., in a waveform viewer and interface created in whatever coding language such as C#, Python, Java or R, allowing the end-user to select time ranges encompassing "normal" or "abnormal" data accordingly. It is also possible to use image file types to select (i.e., define) the time range of interest. File types may include .jpg, .png, .bmp, or other current or future image file types.

In one embodiment, the first set of readings may represent an event automatically identified by the system as a candidate for tagging in later blocks. For example, the system may determine that a particular set of the readings reflects a low average voltage over a period of time, and may present that set of readings to the user as the first set of readings.

As discussed above with respect to FIG. 2, for example, controls may be provided to allow the user to zoom in or out of the data on one or more axes (or dimensions). For example, the user may be provided the option to show the series over a longer or shorter period of time, and may be provided the option to show a wider range of values along the vertical axis. In some embodiments, activating or hovering over a data point (e.g., with a mouse) on the displayed series may cause the underlying measurement to be displayed in proximity to the data point.

In another embodiment, the first set of readings may be displayed (or the option may be provided for the first set of readings to be displayed) in a table or other numerical format in which the measurements themselves are displayed.

In addition to displaying the first set of readings, the graphical user interface may also display end-user or system-determined functions of the first set of readings, or other data derived from the first set of readings. For example, a graphical user interface displaying a voltage reading over time may also display the root-mean-square (rms) voltage. The graphical user interface may also be configured to display known calculated values when the values needed to perform the calculation are displayed and/or available. For example, if a series of measurements representing a current of a component is available, and a series of measurements representing a voltage of the component for the same time period is available, the graphical user interface may be configured to display the instantaneous electrical power (P) derived by the calculation $P(t)=V(t)\cdot I(t)$. Such derived calculations may be automatically displayed, or may be provided or suggested as an option to the user through the user interface.

It is possible to want to allow the end-user to perform a "what if" scenario regarding their selected range of data. For example, the end-user may want to know how the data will be filtered after selecting a "normal" data range. "How the data will be filtered" may include the number/amount of "abnormal" data remaining after the "normal" data has been removed. If an "abnormal" data range is selected, the filtering may provide metrics of the remaining data such as number of potentially similar events in the database or portion of the database that are similar (i.e., meet the criteria to be selected as a match). This will allow the end-user to determine whether or not to accept the original selection or to choose additional characteristics to pare down the data being analyzed.

In some embodiments, the first set of readings and/or characteristics associated with the first set of readings, may be audibly communicated, for example, using a speaker (or speakers) associated with CPU(s) associated with the power system.

At block 1420, a user selection of a portion (or portions) of the first set of readings is received, for example, from a user of the user interface on which first set of readings (and potentially other data) is displayed. In some embodiments, the metrics associated with the user selection may be similar to those described above with respect to the "normal" data or "normal with abnormal" data. The user may further filter the data being compared using one or more analyzable characteristics. For example, the user may find a certain characteristic and filter the data set accordingly. The user may then choose to further filter the data that was selected from the certain characteristic based on the system voltage level. They may then choose to further filter this data again to only include certain times of day, certain meters, certain loads, and so forth.

In accordance with some embodiments of the disclosure, the user corresponds to a person (or persons), for example, a system operator (or operators) responsible for monitoring and managing the power system. In these embodiments, the user may be provided a user input device, such as a mouse, trackball, stylus, microphone, or other input device or component for providing the user selection. For example, in one embodiment the user may select a portion (or portions) of the first set of readings by clicking and dragging a polygon or other shape (e.g., circle or freehand line) around the portion(s) of the first set of readings. In another embodiment, the user selects the portion(s) of the first set of readings by clicking within the user interface at points above the x-axis corresponding to the start time(s) and end time(s) of the desired portion(s) of the first set of readings. In still other embodiments, the user may be prompted to type in coordinates identifying which portion(s) of the first set of readings is to be selected, or otherwise prompted to enter or select a start time (or start times) and an end time (or end times).

In embodiments where the first set of readings is displayed in a table or other numerical format, the user selection of the portion(s) of the first set of readings may be received, for example, by the user highlighting or otherwise selecting the data (e.g., the rows of the table) corresponding to the desired portion(s) of the first set of readings.

The user may additionally or alternatively audibly select the portion (or portions) of the first set of readings in some embodiments, for example, using one or more voice-enabled commands. For example, the user may select particular time periods associated with the portion(s) of the first set of readings by audibly communicating these time periods (e.g., 10:20 AM-10:23 AM on day 1, 11:01 AM-11:02 AM on day 2, etc.) to a user input device (e.g., microphone). The user input device may be directly or indirectly associated with the power system. For example, in some embodiments the user may provide the voice-enabled commands to a microphone associated with a CPU associated with the power system. In other embodiments, the user may provide the voice-enabled commands to a microphone of a smart device, for example, and the smart device may communicate the commands to the CPU.

In some embodiments, the user may additionally or alternatively correspond to or include a system, for example, an artificial intelligence system. In these embodiments, the user (e.g., the artificial intelligence system) may be able read/review and process the first set of readings and provide the user selection. In some embodiments, the system is implemented in the CPU on which the first set of readings may be received. Additionally, in some embodiments the system is implemented on a computing system coupled to the CPU. The computing system may be local to the CPU, for example, on a same site as the CPU, or remote from the CPU, for example, in the "cloud".

As used herein, the terms "cloud" and "cloud computing" are intended to refer to computing resources connected to the Internet or otherwise accessible to the central processing unit via a communication network, which may be a wired or wireless network, or a combination of both. The computing resources comprising the cloud may be centralized in a single location, distributed throughout multiple locations, or a combination of both. A cloud computing system may divide computing tasks amongst multiple racks, blades, processors, cores, controllers, nodes or other computational units in accordance with a particular cloud system architecture or programming. Similarly, a cloud computing system may store instructions and computational information in a centralized memory or storage, or may distribute such information amongst multiple storage or memory components. The cloud system may store multiple copies of instructions and computational information in redundant storage units, such as a RAID array.

In some embodiments in which the user corresponds to or includes a system, the system may be coupled to receive the first set of readings, or data indicative of the first set of readings, directly or indirectly from the CPU on which the first readings may be received. Additionally, in some embodiments in which the user corresponds to or includes a system, the system may be configured to capture/read the first set of readings, or data indicative of the first set of readings, using one or more image capture devices (e.g., an image capture device configured to capture information displayed on the user interface). The system may process/analyze the first set of readings, or data indicative of the first set of readings, to determine and provide the user selection (e.g., of a portion or portions of the first set of readings). In some embodiments, the system may also be coupled to receive additional data (e.g., metadata) from one or more sources, for example, a manufacturing SCADA (supervisory control and data acquisition) system, and use the additional data in determining and providing the user selection.

For example, a system may provide the time stamps as each process step and load starts or ends (such as for example, for a given motor, two start and end times within a first process, then no start within a second process, then one motor start and end time within a third process).

By combining all these different time stamps of status changes, for example, it is possible for the system to slice all the different measurements/time series data (e.g., waveforms) into slices linked to system process steps and load status information. These in turn can be used to tag all the "normal" as well as all the "abnormal" portions. This can either be a continuous process, or it may occur during a "learning phase." If such a learning phase is conducted, any new reading appearing later may be compared to the distinctive portions and the "learned tags" may be applied to any new portion coming into the system. When the system finds new portions which seem to strongly deviate from the learned portions, the system may optionally re-start a "learning phase" specifically focusing on the periods (time portions) of deviations. It may then optionally request all the information of processes and loads and any other relevant information/meta data, (e.g., any control operation or status changes or new loads addition, or load removal etc.) from the system.

At block 1425 of method 1400, at least one user classification of the portion(s) of the first set of readings is received, for example, from the user of the user interface. In one embodiment, the classification, which may include more than one classification in some embodiments, indicates "normal" non-issue data in the first set of readings. In accordance with one embodiment of this disclosure, the "normal" non-issue data corresponds to data/values that are within the specification of the equipment being supplied. For example, a system may be designed to supply a nominal voltage on all three phases that is within the appropriate range. "Normal" non-issue data may be within the nominal range, in amplitude, frequency and phase angle, for example. In accordance with embodiments of this disclosure, "normal" non-issue data should be typical data that is not problematic or not potentially problematic for customer equipment. However, based on one example implementation of this invention, non-issue data may be at the discretion of the customer to determine, based on what they select as "normal" non-issue data.

In some embodiments, the classification(s) are indicated with one or more tags or other textual or graphical labels. The tags or label may, for example, indicate the context of the classification(s) and/or a desired action (or actions) to be taken when a similar set of readings is encountered in the future. The user may be provided the opportunity to type custom tags, or may be provided with a list of existing tags from which to choose. In one embodiment, the system may suggest appropriate tags based on rules, criteria, previously-tagged readings, or other information.

In one embodiment, the user may also be able to add metadata to the tagged data for future reference. For example, the user may indicate the cause of the event the user has tagged. For example, the user may indicate the cause of the event the user tagged. For example, a single-phase fault on the utility system. The metadata may be searched at a later time, for example. In one embodiment, a tag (and the metadata) is associated with an attribute, with the tag providing a value or other input for the attribute. For example, the system may provide for the user to enter a source tag, which identifies the component, system, or subsystem to which the readings relate. The user may also provide a load tag identifying the type of load associated with the reading data. The user may also provide a time period tag identifying a day of week, day of month, week of month, day or month of year, or other distinguishing information about the time in which the reading was taken, such as whether it was a weekend or a peak usage period. The user may also provide a context tag, which may include information relevant to interpreting the reading data and identifying similar future readings. For example, the user may provide a context tag of "heatwave" to indicate that the current weather conditions are such that users are likely using air conditioning (and therefore drawing power from the system) at a higher rate than usual. The user may also provide an event tag, which may include information explaining or characterizing a system operation, function, or condition occurring during the time the readings were taken. For example, an event tag of "startup" may indicate that a motor component is in the transient state of starting up, which may explain variations from expected normal operation. The user may also provide a diagnosis tag, which may include information diagnosing an underlying reason for deviations in the reading data from their expected values. For example, a diagnosis tag of "voltage-sag" may indicate that the reading data reflects a period during which voltage sag was experienced. As another example, a diagnosis tag of "harmonic-content" may indicate that the reading data reflects a period during which harmonic content is experienced in the system. Harmonic content is an undesirable phenomenon in multi-phase systems, and can negatively affect power quality of the system.

It is understood that other types of power quality issues/events may also negatively affect power quality of the system. For example, a voltage sag, a voltage swell, a voltage transient, an instantaneous interruption, a momentary interruption, a temporary interruption, waveform distortion, power frequency variation, imbalance, and a long-duration root-mean-square (rms) variation are examples of power quality issues that may negatively affect power quality of the system.

In accordance with embodiments of this disclosure, the user may also provide an assessment tag, which may indicate a conclusion relating to the diagnosis or other characterization of the reading data. For example, an assessment tag of "abnormal" may be provided. The user may also provide a notification tag, which may indicate whether notifications should be sent to draw attention to a recent, ongoing, or recurring issue identified in the reading data. The user may also provide an action tag, which may include instructions that the system should initiate automatically in response to a detected system operation, function, or condition of the power system or a component thereof. In some embodiments, the system may automatically take or suggest certain actions in response to a second set of readings being tagged, regardless of whether an action tag has been specified. For example, where the second set of readings indicates that system failure, or damage to the system, is imminent, a breaker may be tripped to disable the affected component or reroute current around the component to avoid an outage.

Additional tagging features and functionality may be provided, such as tags having predefined values or meanings that are recognized by the system. For example, a characterization tag may be expected or requested from the user with the assigned value having a meaning to the system. Assigning the characterization tag a value of "too-low" may be recognized by the system as providing an upper boundary by which lower readings can in the future be automatically tagged as "too-low" as well. Similarly, assigning a characterization tag of "average" may be compared with other "average" characterization tags to determine a band of readings that may be considered and tagged as "average."

The user may be allowed to create, with some limitations, user-specific tags as desired, and tags may have no inherent meaning beyond the association created between a tag and a portion of the first set of readings. Rules may be enforced to distinguish between system and user-created tags, and tags may be displayed differently depending on whether they were created by the system or user. For example, system-created tags may be all lowercase, whereas user-created tags may be required to start with an upper-case letter. System and user-created tags may be displayed in different colors, font sizes, or otherwise visually differentiated, as well.

At block 1430 of method 1400, portion(s) of the first set of readings are identified and removed based on the at least one user classification received at block 1425 to generate a modified set of readings. For example, at block 1430 "normal" non-issue data may be automatically identified and removed from the first set of readings, leaving only "abnormal" potential issue data in the modified set of readings. In some embodiments, "normal" non-issue data may additionally or optionally be tagged as well.

At block 1435, the modified set of readings are classified by at least one characteristic. In some embodiments, the at least one characteristic is associated with one or more potential issues in the power system. In some embodiments, the potential issues include power quality issues in the power system. The power quality issues may include, for example, at least one of: a voltage sag, a voltage swell, a voltage transient, an instantaneous interruption, a momentary interruption, a temporary interruption, waveform distortion, power frequency variation, imbalance, and a long-duration root-mean-square (rms) variation. Grounding/earthing and/or grounded/earthed issues may optionally be included as "abnormal" potential issue data as well. It is understood that other power quality issues/events may affect the power system, for example, as discussed in the Summary section of this disclosure.

In some embodiments, classifying the modified set of readings by at least one characteristic includes automatically sorting the "abnormal" potential data into one or more categories. In some embodiments, the categories include one or more power quality categories. The power quality categories may include, for example, at least one of sags, swells, frequency variations, phase imbalance, waveform distortion, and transients.

In some embodiments, the categories additionally or alternatively include at least one of real, reactive, apparent power changes (up or down), and power factor changes (leading, lagging, or some specific threshold). Additionally, in some embodiments at least some of the categories are associated with frequency-based categories. The frequency-based categories may include, for example, at least one of: total voltage and/or current harmonic distortion, a specific harmonic component(s), interharmonic(s) distortion, and sub-harmonic distortion in some embodiments. In some embodiments, at least some of the categories are based on sequence (also sometimes referred to as symmetrical or sequential) component values. The sequence component values may include, for example, at least one of: positive, negative, zero sequence voltage(s) and current(s). The categories may also include grounding/earthing and/or grounded/earthed issues.

In some embodiments, the categories additionally or alternatively are based on interphase relationships (with the same or different parameters, i.e., voltage versus voltage or voltage versus current) such as one characteristic on a phase vs. the same or another characteristic on a different phase. The categories could be also be based on a characteristic(s) on one or more voltage phases vs. the same or different characteristic(s) on one or more current phases. The characteristic could be operational such as turning a load(s) on, off or changing state. The categories could also be a non-energy-related related characteristic(s) (metadata) such as date, time, load-type(s) (e.g., motor, variable speed drives, lighting, etc.), process, shift, manufacturer, location, meter type, and so forth.

It is understood that the above categories are but some of many potential categories by which the "abnormal" potential data may be automatically sorted.

In some embodiments, the at least one characteristic by which the modified set of readings is classified is stored for later comparison with other sets of readings (e.g., second, third, fourth, etc. sets of readings). In some embodiments, the entire portion(s) of the first set of readings and/or the modified set of readings may be stored, or a regression model or fitted data points generated therefrom may be stored. In one example, the maximum, minimum, mean, or standard deviation of reading(s) in the portion(s) of the first set of readings and/or the modified set of readings may be stored. In another example, the deviation of the readings from an expected, average, or determined threshold reading may be stored.

At block 1440, the at least one characteristic is detected in an additional or next set of readings, for example, a second set of readings. The one or more characteristics are detected by evaluating how the next (e.g., second) set of readings relates to the readings, criteria, threshold, or model determined with respect to one or more readings previously tagged by the system or users. For example, if the maximum, minimum, mean, or standard deviation of reading(s) in the portion(s) of the first set of readings is stored, the maximum, minimum, mean, or standard deviation of readings in the next set of readings may be compared to those of the portion of the first set of readings in order to determine if a sufficient correlation or any other similarity(s) or dis-similarity(s) exists. As another example, and discussed above, a regression model may be determined from the next set of readings, and the resulting model or function, may be compared to the portion(s) of the first set of readings. A set of data points occurring at standardized intervals may be generated from the resulting model, so that comparison can be made with the characteristics of the portion(s) of the first set of readings, to determine if a correlation or any other similarity(s) or dis-similarity(s) exists.

A comparison to a portion (or portions) of a first set of readings having a defined tag may also be performed. For example, a determination that a next set of readings is higher than a portion (or portions) of a first set of readings tagged "too-high" may cause the next set of readings to be tagged "too-high" as well.

It will be appreciated that while the examples given here refer to a comparison with a portion (or portions) of the first set of readings for simplicity of illustration, it is possible and desirable to compare the next set of readings to any number of available previously-tagged or generated readings (e.g., the modified set of readings) in order to best tag the next set of readings. A larger set of previously-tagged readings allows for greater refinement of the thresholds and criteria according to which classifications are applied to later readings. For example, the system may use a set of readings previously tagged as "too-low" to determine the upper threshold of what constitutes a reading that should be tagged as "too-low" in the future.

In one embodiment, the one or more characteristics are detected in a next set of readings by comparison to the portion(s) of the first set of readings without regard to the time period covered by either set of readings. Where a next set of readings may have a characteristic of the portion(s) of the first set of readings, a commonality may be determined even where, for example, the portion(s) of the first set of readings spans less than 5 minutes, and the next set of readings covers a time period of 2 hours. The minimum, maximum, mean, overall trend, shape, progression, or outcome of the two sets of readings may be compared to determine if there is a correlation or any other similarity(s) or dis-similarity(s). Such a correlation or any other similarity(s) or dis-similarity(s) may be found through dynamic time warping (DTW) algorithms, shape matching, or other techniques known in the art.

At block 1440, the classification is applied to the additional or next set of readings, for example, the above-discussed second set of readings. System- and/or user-created tags associated with the portion of the first set of readings are associated with (i.e., applied to) the next (e.g., second) set of readings. For example, if a portion (or portions) of the first set of readings was tagged with the "voltage-sag" tag at block 1425, and the next set of readings is determined at block 1440 to share a characteristic of the portion (or portions) of the first set of readings such that there is sufficient correlation or any other similarity(s) or dis-similarity(s) between the two, then the next set of readings is also tagged with the "voltage-sag" tag.

Tags may be associated with the next set of readings based on other tags applied to the next set of readings. To continue the previous example, if the portion(s) of the first set of readings has been tagged "voltage-sag," and the portion(s) of the first set of readings has also been tagged "abnormal," then the second set of readings may be tagged "abnormal" as well. In another example, if a portion (or portions) of the first set of readings from a motor component has been tagged "power-impulse/spike" and "startup" (indicating that the portion(s) of the first set of readings corresponds to an expected power spike experienced during startup of a motor), and has also been tagged "normal," then the application of the "power-impulse/spike" and "startup" tags to the second set of readings may cause the "normal" tag to be applied to the next set of readings as well.

In general, additional tags may be applied to a set of readings by applying logic to a set of previous tags already applied to the set of readings, with a high degree of logical complexity provided for. In another example, if a portion of a first set of power readings from a motor component has been tagged "too-high" and "abnormal," and a second set of readings from the same component has some of the same characteristics, the presence of a "startup" tag applied to the second set of readings (indicating that the motor is in a startup phase) may cause the system to recognize that a power impulse/spike at startup is normal, and tag the second set of readings as "normal."

After the tags have been applied to the next set of readings, the next set of readings and the associated tags may be displayed via a user interface (e.g., user interface 50). The tags may be visually displayed to convey additional information. For example, a confidence level may be determined reflective of the system's confidence in applying a particular tag to the second set of readings, and the tag may be displayed at a brightness varying according to the confidence level.

At block 1450, which is optional in some embodiments, an operation may be controlled or performed on one or more aspects of the power system, for example, in response to the next (e.g., second) set of readings being classified in response to the at least one characteristic being detected in the second set of readings. For example, once an abnormal event has been identified through this process, it would be possible to perform an action such as turning a load(s) off, inhibiting a load(s) from running, order replacement parts, shutting down a line, and so forth. Other example operations include installing a mitigative device such as a diesel generator, throw-over or static switch, etc., and adjusting parameters associated with a load, for example, as described in co-pending U.S. patent application Ser. No. 16/233,220, entitled "Systems and Methods for Characterizing Power Quality Events in an Electrical System," which is assigned to the same assignee as the present disclosure.

At block 1455, which is also optional in some embodiments, it may be determined if there are any unclassified readings. If it is determined that there are no unclassified readings, the method may end (as indicated by block 1460) in some embodiments. Alternatively, if it is determined that there are unclassified readings (e.g., from third, fourth, fifth, etc. sets of readings), the method may return, for example, to block 1440 where the unclassified readings may be processed to identify and indicate new abnormal readings that are unclassified (e.g., in response to detecting the at least one characteristic in the unclassified readings). At block 1445, the unclassified readings may be classified, for example, by at least the at least one characteristic by which the modified set of readings was classified at block 1435.

In some embodiments in which the method ends, the method may be initiated again, for example, in response to the CPU receiving new set(s) of readings from the monitors. Additionally, in some embodiments the method may be initiated again in response to user input and/or a control signal, for example. The control signal may be received, for example, from a control system or device associated with the power system.

It is understood that method 1400 (and the other methods disclosed herein) may include one or more additional blocks or steps in some embodiments. For example, in some embodiments method 1400 may include evaluating each classification for additional common or dissimilar characteristics within the classification to identify new classifications or sub-classifications, for example, as discussed further below in connection with FIG. 4B. Other example aspects of this invention are described below.

Figure 4C:
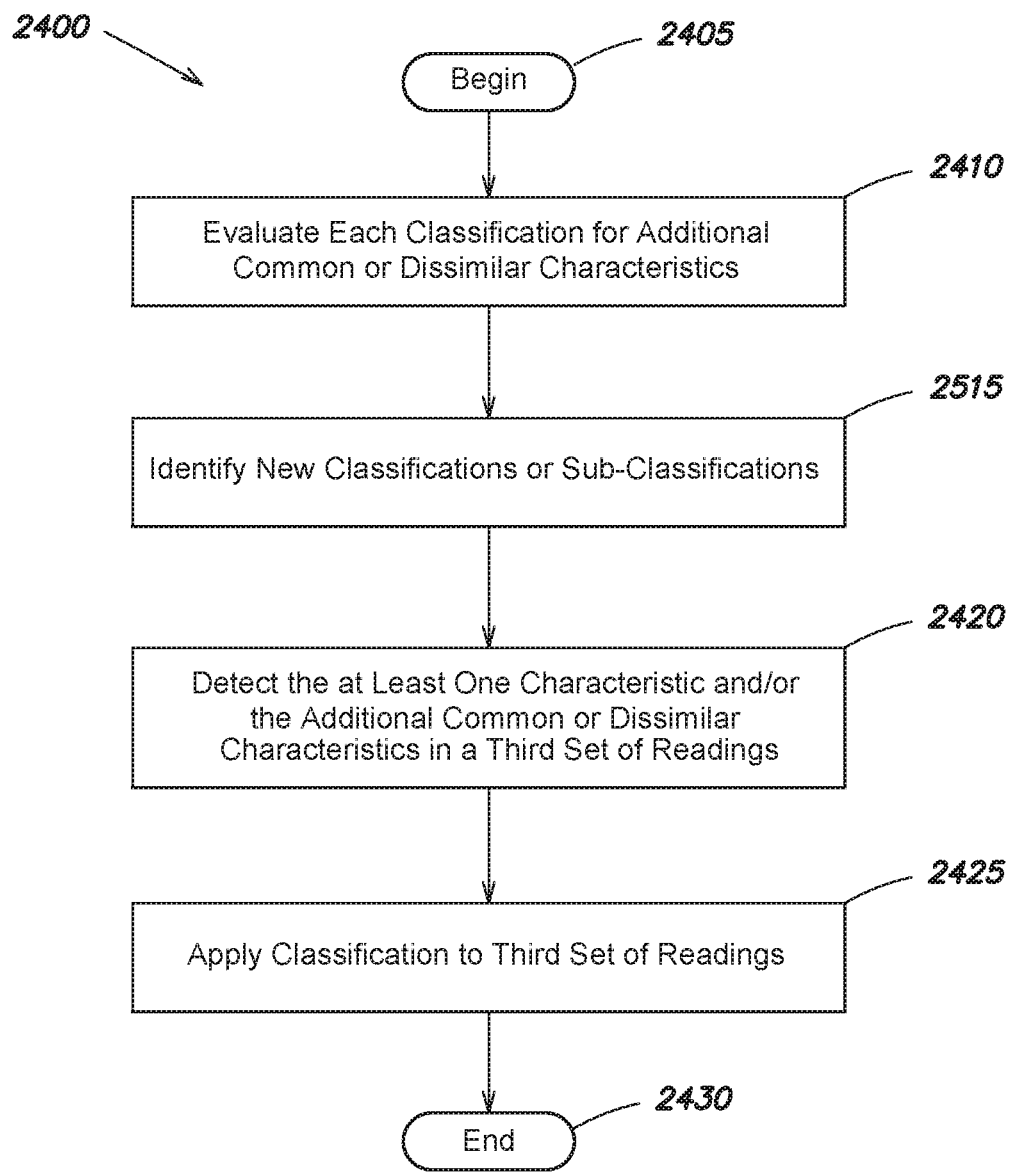
FIG. 4C is a flowchart of an example method for classifying sets of readings.

Referring to FIG. 4C, an example method 2400 for classifying readings is illustrated. In accordance with some embodiments of this disclosure, the method 2400 corresponds to example steps that may be performed subsequent to automatically classifying the additional or next (e.g., second) set of readings at block 1445 of method 1400. In particular, in one aspect of the disclosure the method 2400 may be used to determine what to do when different users have classified the same portions of data into different classifications, for example, with different tags being applied to the same portions of data. For example, one user may have classified a portion of data as "normal", another user may classify the data portion as "abnormal" (e.g., as one of many possible ones, the illustration of different classifications in FIGS. 6A, 6B, 6C). In one aspect of the disclosure, the method 2400 may applied when the same user, over time, in another context (such as one possible example of different context would be in two different processes using a same load such as a motor) has classified very similar looking portions into two different classifications. The method 2400 may also be used to solve cases where one event comprises at least part of another, and this results in at least two different classifications. Additionally, the method 2400 may be applied in instances in which the system finds several matches with same confidence index; some users having tagged similar complete measurements while other users have tagged the two different sub-portions of similar measurements dis-similarly.

In general, there is a need for defining a reconciliation process. Method 2400 describes one example implementation of a reconciliation process of multiple classifications, or of segregating between similar looking portions of data yet per user defined different classifications, as well as reconciling sub-portions (e.g., sub-sequences) with each other (such as one example among others, by defining optimal time stamp of change point between a first portion of data and a second portion of data), as well as how to combine several sub-portions into a more global whole (e.g., a measurement has two portions which correspond to two different classification, but has also a global tag by some users to again a third classification). The goal is to best define a classification to any future (e.g., new similar) measurement(s) or control signal(s).

It is understood that inconsistent tagging of data may be reconciled in many ways. It is also understood the functionality described herein, for example, with reference to FIGS. 4-4C, can be employed on systems having multiple users. For example, the system may characterize a second set of readings by comparing them to multiple previous readings tagged by different users. In some situations involving multiple users, it may be expected that tags may conflict or otherwise be incompatible. For example, one user may tag a set of readings as "abnormal" and "too-high," whereas another user may tag the same set of readings as "normal" and "average." This may be due, for example, to two different users applying two different standards (that have different thresholds) to the same data. The system may later identify a characteristic of those earlier sets of readings in a second set of readings, and, in attempting to apply the tags associated with those earlier readings, may determine that the tags are in conflict. To continue the example, the system may determine that "normal" and "abnormal" tags are in inconsistent (e.g., in conflict with each other).

Returning now to FIG. 4C, as illustrated in FIG. 4C, at block 2405 the method 2400 begins.

At block 2410, each possible alternate classification, both for the complete measurement as well as for all the possible sub-portions (aka sub-segments if one slices the measurement into parts such as illustrated in FIG. 3 in 320 and 330), for the at least one classification applied at block 1445, is evaluated for additional common or dissimilar characteristics within the classification.

At block 2415, new classifications or sub-classifications are identified based on the evaluation performed at block 2410. One example method for identifying new classifications or sub-classifications is discussed below in connection with FIG. 4C, for example.

At block 2420, at least one characteristic and/or the additional common or dissimilar characteristics are detected in a new set of readings (e.g., a third set of readings) based on a correlation or any other similarity(s) or dis-similarity(s) between the new set of readings and one or more previous sets of readings (e.g., first and/or second sets of readings). In some embodiments, the at least one characteristic corresponds to the at least one characteristic detected at block 1440 of method 1400, for example.

At block 2425, the new set of readings is classified in response to the at least one characteristic and/or the additional common or dissimilar characteristics being detected in the new set of readings based on the correlation/similarity(s) and/or dis-similarity(s) between the new set of readings and the one or more previous sets of readings. This may be done using expert rules (such as non-limitative examples "use the most comprehensive portion, not the sub-portions classifications"; "take the highest confidence scoring classification for the whole measurement"; "slice the global measurement into sub-portions and use each distinct classification for each portion"); based on Machine Learning or other statistical or Artificial Intelligence algorithms (such as, among other possible tools and methods, optimization of global confidence score algorithms, cluster analysis of classifications, time series clustering, and so forth).

Subsequent to block 2425, the method may end in some embodiments (as indicated by block 2430), repeat again, or include one or more additional steps, for example.

Figure 4D:
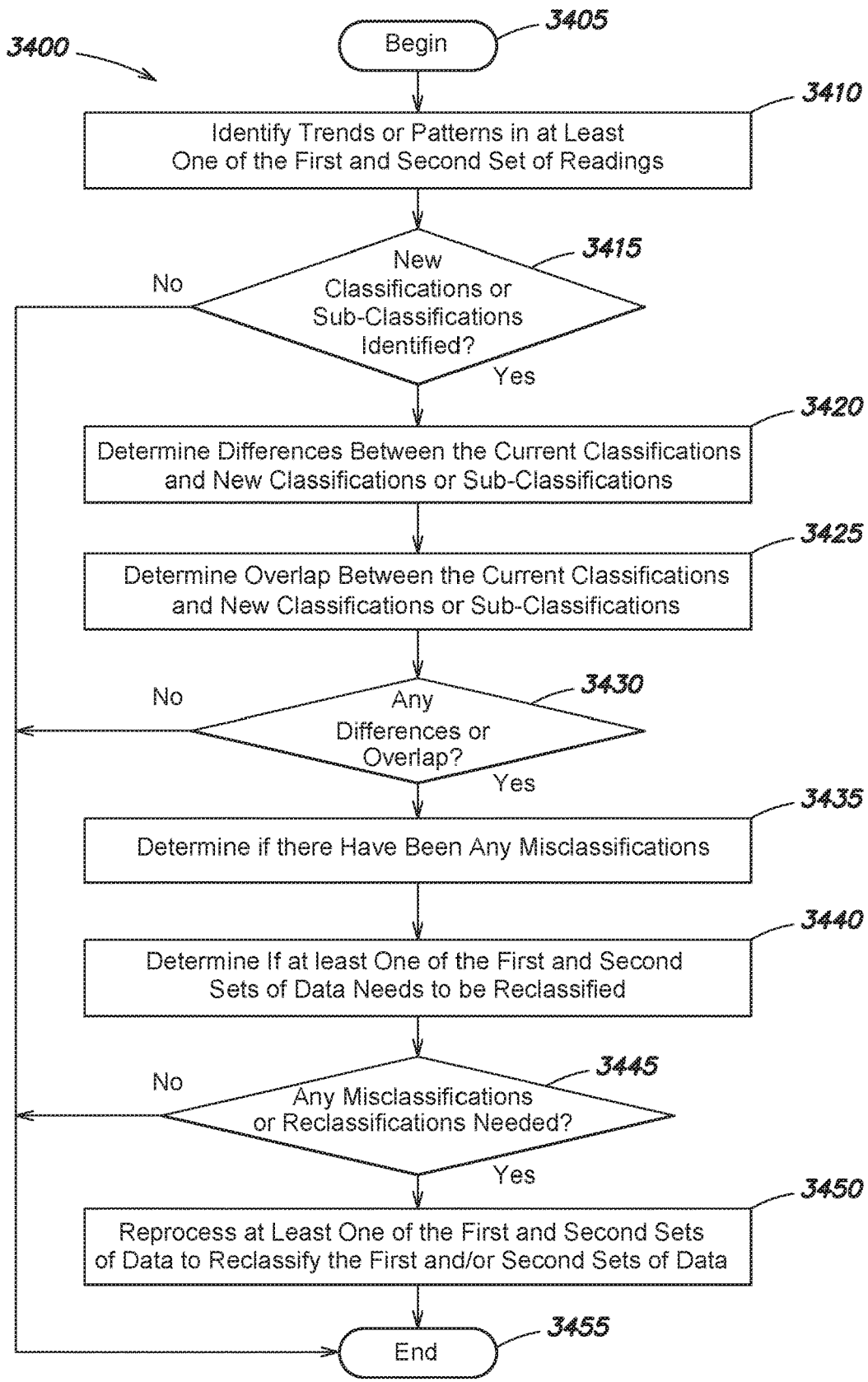
FIG. 4D is a flowchart of an example method for identifying new classifications or sub-classifications, and evaluating previously identified/generated classifications or sub-classifications.

Referring to FIG. 4D, an example method 3400 for identifying new classifications or sub-classifications, and evaluating previously identified/generated classifications or sub-classifications is illustrated. In accordance with some embodiments of this disclosure, the method 3400 corresponds to example steps that may be performed in combination with method 2400 discussed above.

As illustrated in FIG. 4D, at block 3405 the method 3400 begins.

At block 3410, trends or patterns are identified in one or more sets of readings (e.g., first and/or second sets of readings) to identify new classifications or sub-classifications.

At block 3415, it is determined if new classifications or sub-classification have been identified. If it determined that new classifications or sub-classifications have been identified, the method may proceed to block 3420. Alternatively, if it determined that new classifications or sub-classifications have not been identified, the method may end in some embodiments.

At block 3420, differences between current classifications and the newly identified classifications or sub-classifications are determined. Additionally, at block 3425 overlap between current classifications and the newly identified classifications or sub-classifications are determined. In accordance with some embodiments of this disclosure, a confidence score is calculated for each. In some embodiments, the confidence score can correspond to, or be indicative of, a confidence level of there being overlap between the current classifications and the newly identified classifications or sub-classifications. For instance, in some embodiments the system can determine a confidence score with reference to qualitative degrees of certainty of overlap between the current classifications and the newly identified classifications or sub-classifications. In these embodiments, classifications or sub-classifications for which the system has identified overlap, for example, based on non-direct data, would be associated with a low confidence level. Additionally, classifications or sub-classifications for which the system has identified overlap, for example, based on a combination of direct and non-direct data, would be associated with a medium confidence level. Classifications or sub-classifications for which the system has identified overlap, for example, based on user validated data, would be associated with a highest confidence level.

At block 3430, it is determined if there are any differences or overlap between current classifications and the newly identified classifications or sub-classifications based on the determinations made at blocks 3420 and 3425, for example, based on the confidence score. If it determined that there are differences or overlap between current classifications and the newly identified classifications or sub-classifications (e.g., based on a medium or high confidence score), the method may proceed to block 3435. Alternatively, if it determined that there are no differences or overlap between current classifications and the newly identified classifications or sub-classifications (e.g., based on a low confidence score), the method may end in some embodiments.

At block 3435, it is determined if there have been any misclassifications. Additionally, at block 3440 it is determined if at least one of the previously classified sets of data (e.g., first and/or second sets of readings) needs to be reclassified.

At block 3445, it is determined if there have been any misclassifications or if reclassifications are needed to previously classified sets of data based on the determinations made at blocks 3435 and 3440. If it determined that there have been misclassifications or if reclassifications are needed, the method may proceed to block 3450. Alternatively, if it determined that there have not been any misclassifications or if no reclassifications are needed, the method may end in some embodiments.

At block 3450, the previous set(s) of readings for which there have been misclassifications or for which reclassifications are needed is reprocessed to apply new or updated classifications and/or subclassifications.

Subsequent to block 3450, the method may end in some embodiments (as indicated by block 3455), repeat again, or include one or more additional steps, for example.

In another embodiment of reconciling inconsistent tagging (i.e., addressing conflict resolution), the system may preserve and identify each individual's tags, such as by tagging the second set of readings both "@johndoe-normal" and "@bobsmith-abnormal."

In yet another embodiment of conflict resolution, the system may resolve the conflict by applying a tag provided by a majority of users.

An embodiment of a method for sending notifications in response to events, for example, events identified using at least one of methods 400, 1400, 2400, 3400 shown in FIGS. 4-4D, is illustrated generally at 500 in FIG. 5.

At block 510, the method begins.

At block 520, a determination is made that a notification should be generated in response to a classification being applied to a set of readings (e.g., as in block 480 of method 400). The determination is made in response to one or more tags meeting a notification criteria for one or more users. The determination may be made in response to a predetermined notification tag being applied to the set of readings. For example, the association of the tag "notify" with the set of readings may determine that a notification should be generated. The determination may be made in response to defined tags being assigned, such as an Assessment tag of "abnormal" being assigned to the set of readings.

Notifications are configurable by their intended recipients or other users, including system administrators. For example, a user may indicate a desire to receive a notification whenever the tags "notification" or "abnormal" are applied to a set of readings. Logical operators may be employed. For example, a user responsible for a subsystem called Subsystem 1 may wish to only receive notifications when the Assessment tag "abnormal" and the Meter Name tag "SubSys1" are applied to the set of readings. System administrators may configure default or override notification settings, to ensure that certain users receive certain notifications regardless of their personal configuration for notifications. In another embodiment, notification settings may be configured through the tags themselves. For example, a user may have defined, as part of method 400, that a particular event should be tagged as "@johnsmith-notify." The presence of that tag could cause the system, as part of the current process, to determine that a notification should be generated. Additional parameters regarding the notification may also be indicated in the tag, e.g., "@johnsmith-notify-pager."

At block 530, a notification is generated and sent. User notification and preference information may be stored in a database accessible by the system, so that the notification may be delivered. For example, when one or more individuals should receive a notification, the contact preferences of the individual may be accessed and used to contact the individual. Preferences may include the method of contact (e.g., email, voicemail, SMS/MMS message, pager), the times of day during which notifications should or should not be sent, and the contact information (e.g., email address, phone number, etc.) The content of the notification may be configurable, and may comprise a short message indicating a status of a component, the fact that one or more tags were applied to the set of readings, or other information. The notification may contain a URL or short URL directing a browser to a location that provides additional information. The notification may also contain an image, or a link to an image, depicting the set of readings graphically in much the same way as seen in FIGS. 2A, 2B, and 3.

Method 500 ends at block 540.

In some embodiments, the system is also configured to automatically perform certain tasks in response to a tag being applied to the second set of readings. For example, a portion of a first set of readings may have previously been tagged by a user as indicative of harmonic content, and may also have been tagged with an action tag indicating that the system should apply a harmonic filter to the affected current. Thus, when a second set of readings is detected as having harmonic content, the system may automatically apply a harmonic filter to the system in order to remediate the issue.

To continue an earlier example, where a second set of readings is tagged as indicating a voltage sag, the simultaneous or imminent startup of any motors or other components may be postponed and/or staggered to mitigate the voltage sag.

In some embodiments, the action associated with the action tag is performed automatically without delay. In other embodiments, a system operator or other user is prompted to perform the action, or the system may issue a notification that the action will be performed after some certain amount of time unless an instruction to the contrary is received.

Figure 6:
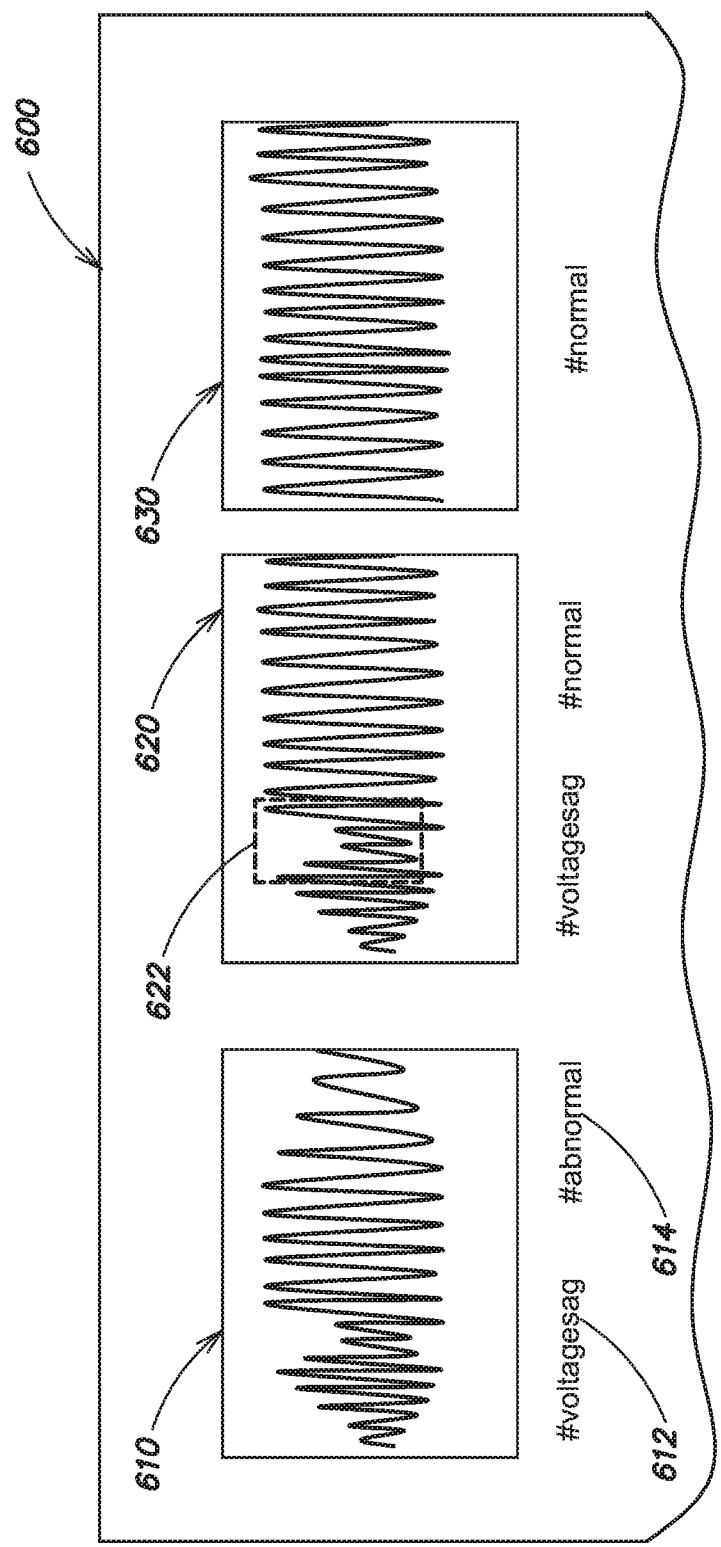
FIG. 6 is an example of a user interface.

Additional viewing capabilities of the readings recently or previously tagged may be provided. In one embodiment, a user interface is provided to visually present a user with multiple thumbnail or reduced-size images of previously-tagged data, along with the tags applied to the data. The user may interact with the system to view previously-tagged data, or add/remove/modify tags associated with the data. An example of such a user interface 600 is shown in FIG. 6. Interface icons 610, 620, 630 each depict tagged portions of data, with the relevant tags displayed in proximity to the respective interface icon. For example, the tag 612 "# voltagesag" and the tag 614 "# abnormal" are displayed beneath the respective interface icon 610. Clicking on the interface icons 610, 620, 630 may cause the portion of the series displayed in the interface to be displayed in a larger, interactive display (e.g., user interface 600). The selection associated with the tag may also be displayed. For example, selection 622 previews the portion of the user interface 620 that has been tagged "# voltagesag" and "# normal."

Clicking on a tag 612, 614 may cause the plurality of interface icons to be filtered so that only interface icons displaying data associated with measurements tagged with that tag are displayed. For example, clicking on the tag 612 "# voltagesag" may cause interface icon 630 (tagged only as "normal") to not be displayed in the interface 600, because the interface icon 630 is not tagged "# voltagesag." Interface icons 610, 620, and any other interface icons associated with measurements tagged "# voltagesag" would continue to be displayed. Clicking on a tag a second time may toggle the filter off, such that all interface icons are displayed again. Multiple tags may be combined to create a complex multifactor filter. Logical operators, such as "NOT," "AND," or "OR" may also be employed in a filter. For example, the user may wish to display in interface 600 only those interface icons representing data that has been tagged "# voltagesag NOT # abnormal."

Figure 6A:
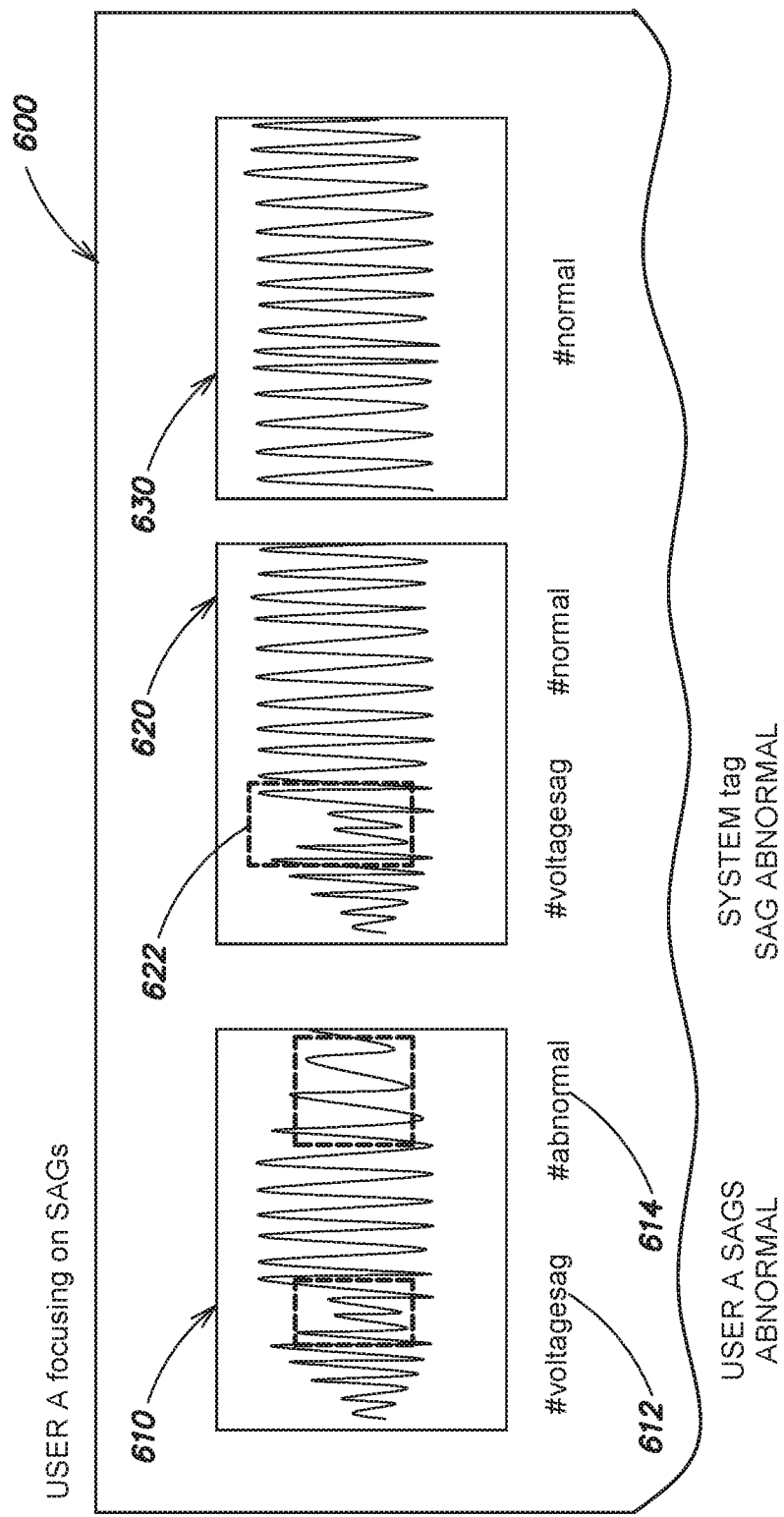
FIG. 6A shows an example tagging of events in a user interface.
Figure 6B:
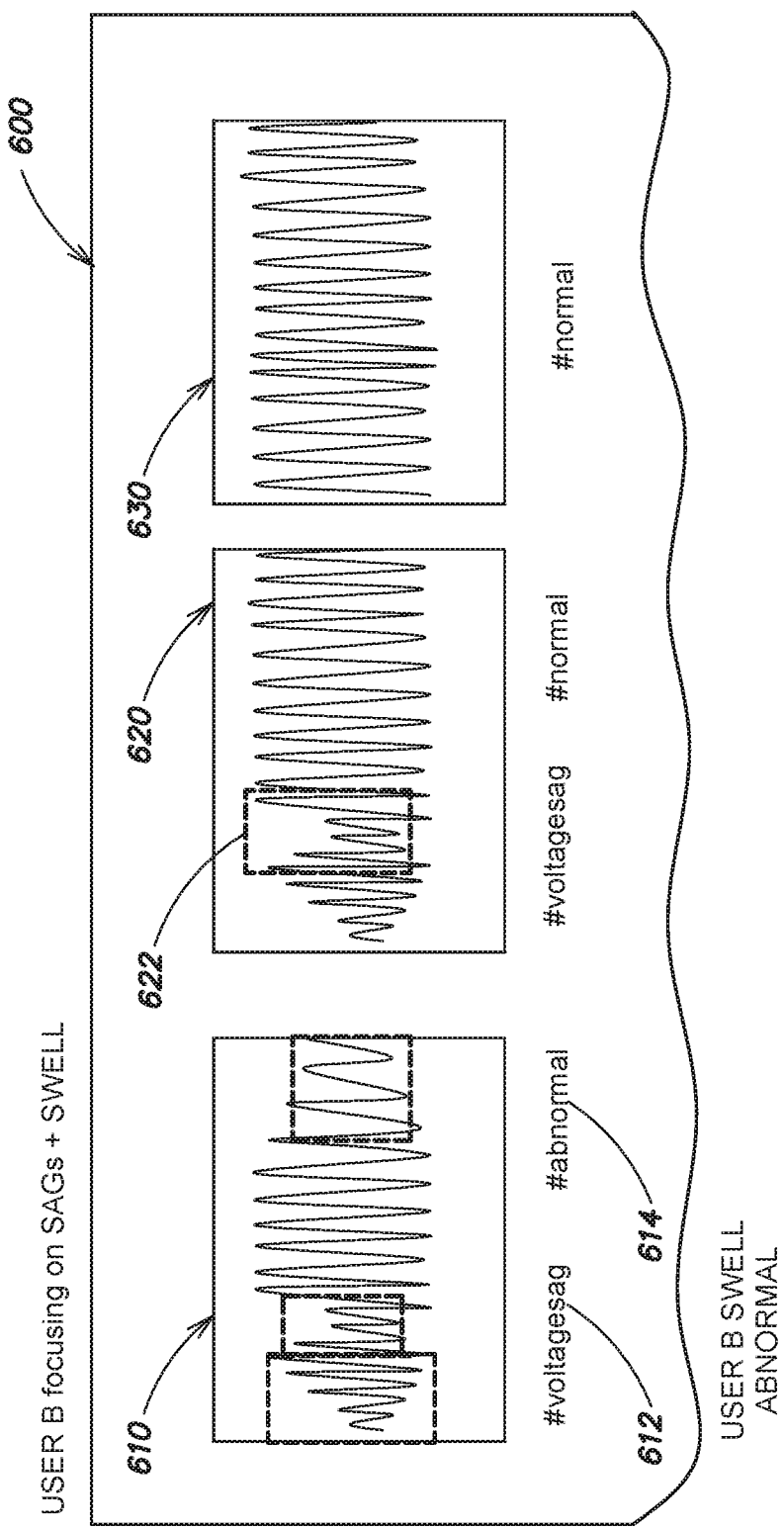
FIG. 6B shows another example tagging of events in a user interface.
Figure 6C:
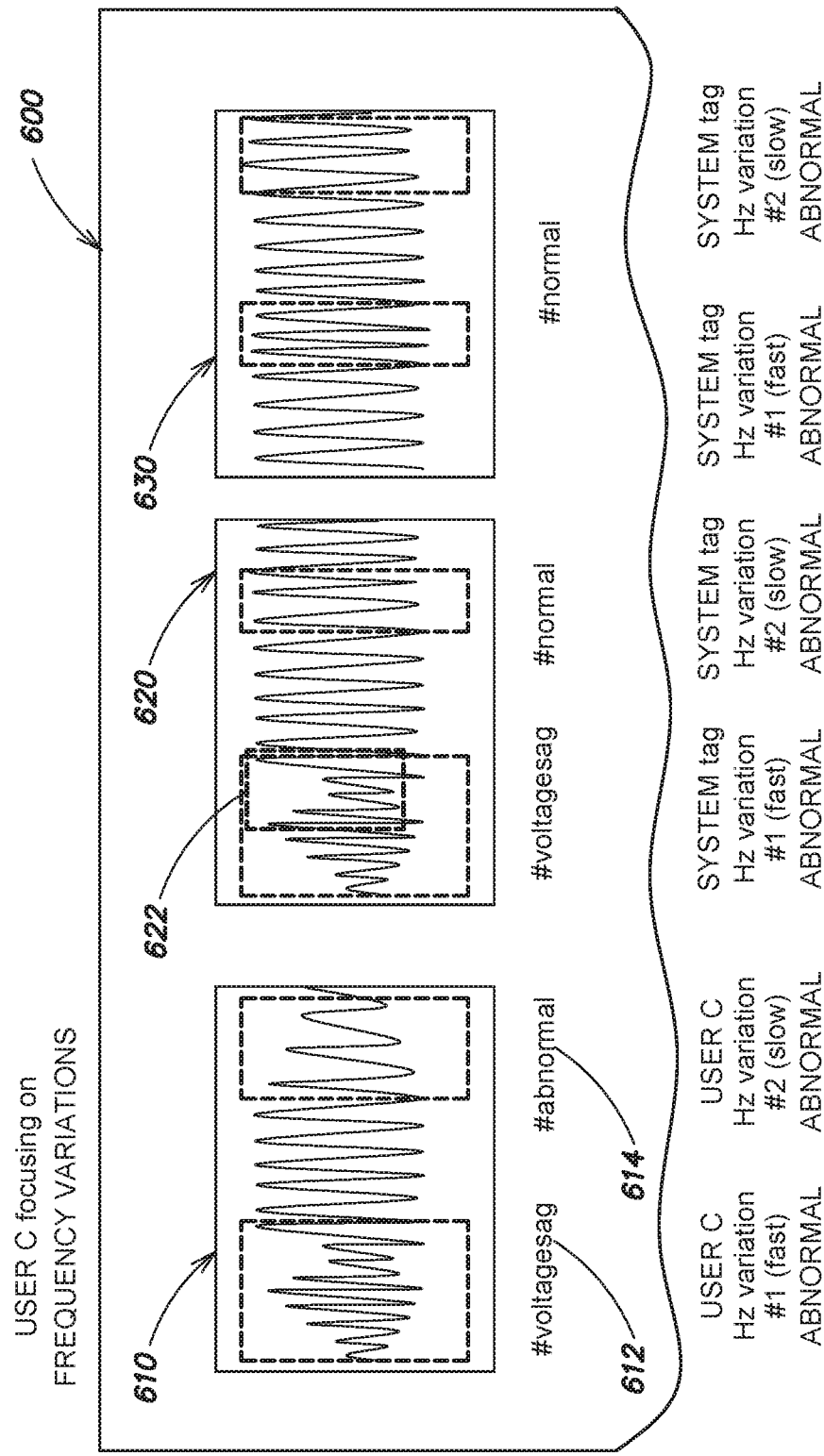
FIG. 6C shows another example tagging of events in a user interface.

Referring to FIGS. 6A, 6B and 6C, in which like elements in FIG. 6 are shown having like reference designations, it can be seen that the same waveform may be tagged by multiple users (here, three users) in a different, yet coherent way. Each user may have different notions/concepts/topics to consider. For example, User A may focus only on sags (e.g., as shown in FIG. 6A) due to their potential impact on loads. User B may focus on sags and swells (e.g., as shown in FIG. 6B). User C may focus only on frequency variations (e.g., as shown in FIG. 6B). For example, User B be interested in when the power frequency increases or decreases beyond a given threshold, which may impact some loads and/or certain processes.

Returning to FIG. 1, one or more components of the system, including the CPU 10, notification interface 40, and user interface 50, may include a computerized control system. Various aspects may be implemented as specialized software executing in a general-purpose or specialized computer system 700 such as that shown in FIG. 7. The computer system 700 may include a processor 702 connected to one or more memory devices 704, such as a disk drive, solid state memory, or other device for storing data. Memory 704 is typically used for storing programs and data during operation of the computer system 700.

Components of computer system 700 may be coupled by an interconnection mechanism 706, which may include one or more busses (e.g., between components that are integrated within a same machine) and/or a network (e.g., between components that reside on separate discrete machines and/or between monitors 70, notification interface 40, user interface 50, and/or CPU 10). The interconnection mechanism 706 enables communications (e.g., data, instructions) to be exchanged between system components of system 700. Computer system 700 includes one or more input devices 708, for example, a keyboard, mouse, trackball, microphone, or touch screen through which an operator may issue commands or programming to the system 700. Computer system 700 includes one or more output devices 710, for example, a printing device, display screen, and/or speaker. In addition, computer system 700 may contain one or more interfaces (not shown) that connect computer system 700 to a communication network in addition or as an alternative to the interconnection mechanism 706. These interfaces may be utilized by the central processing unit to collect data from monitors and/or to communicate with the monitors. These interfaces may include a communication pathway for notifications to be sent.

Figure 8:
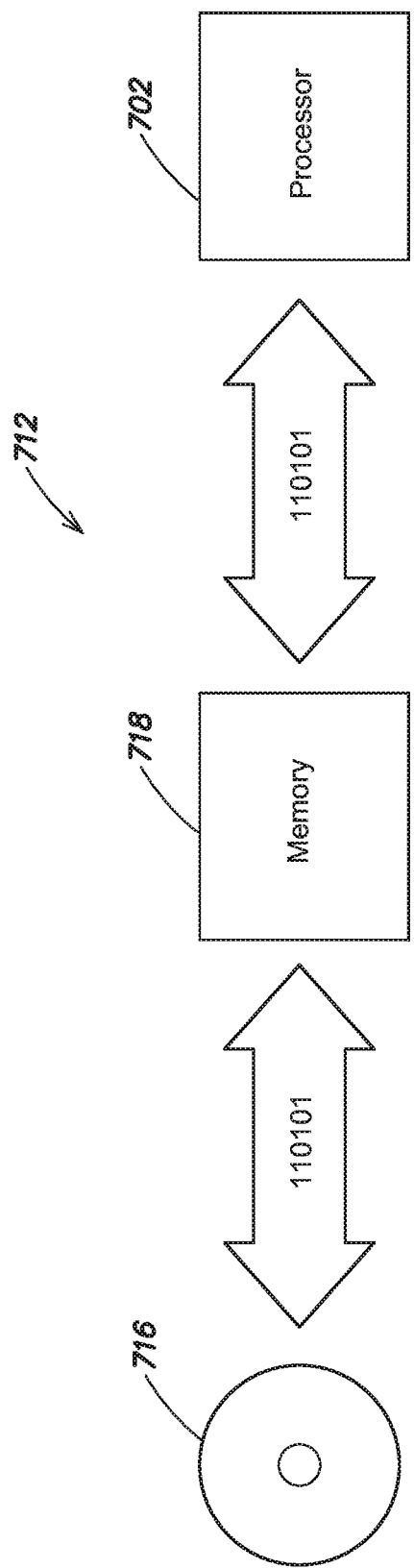
FIG. 8 is a schematic of a memory system of the computer of FIG. 7.

The storage system 712, shown in greater detail in FIG. 8, typically includes a computer readable and writeable nonvolatile recording medium 716 in which signals are stored that define a program to be executed by the processor or information to be processed by the program. The medium may include, for example, a disk or flash memory. Typically, in operation, the processor causes data to be read from the nonvolatile recording medium 716 into another memory 718 that allows for faster access to the information by the processor than does the medium 716. This memory 718 is typically a volatile, random access integrated circuit memory such as a dynamic random access memory (DRAM) or static memory (SRAM). It may be located in storage system 712, as shown, or in memory system 704. The processor 702 generally manipulates the data within the integrated circuit memory 718 and then copies the data to the medium 716 after processing is completed. A variety of mechanisms are known for managing data movement between the medium 716 and the integrated circuit memory element 718, and embodiments disclosed herein are not limited to any particular data movement mechanism. Embodiments disclosed herein are not limited to a particular memory system 704 or storage system 712.

The computer system may include specially-programmed, special-purpose hardware, for example, an application-specific integrated circuit (ASIC). Embodiments disclosed herein may be implemented in software, hardware or firmware, or any combination thereof. Further, such methods, acts, systems, system elements and components thereof may be implemented as part of the computer system described above or as an independent component.

Figure 7:
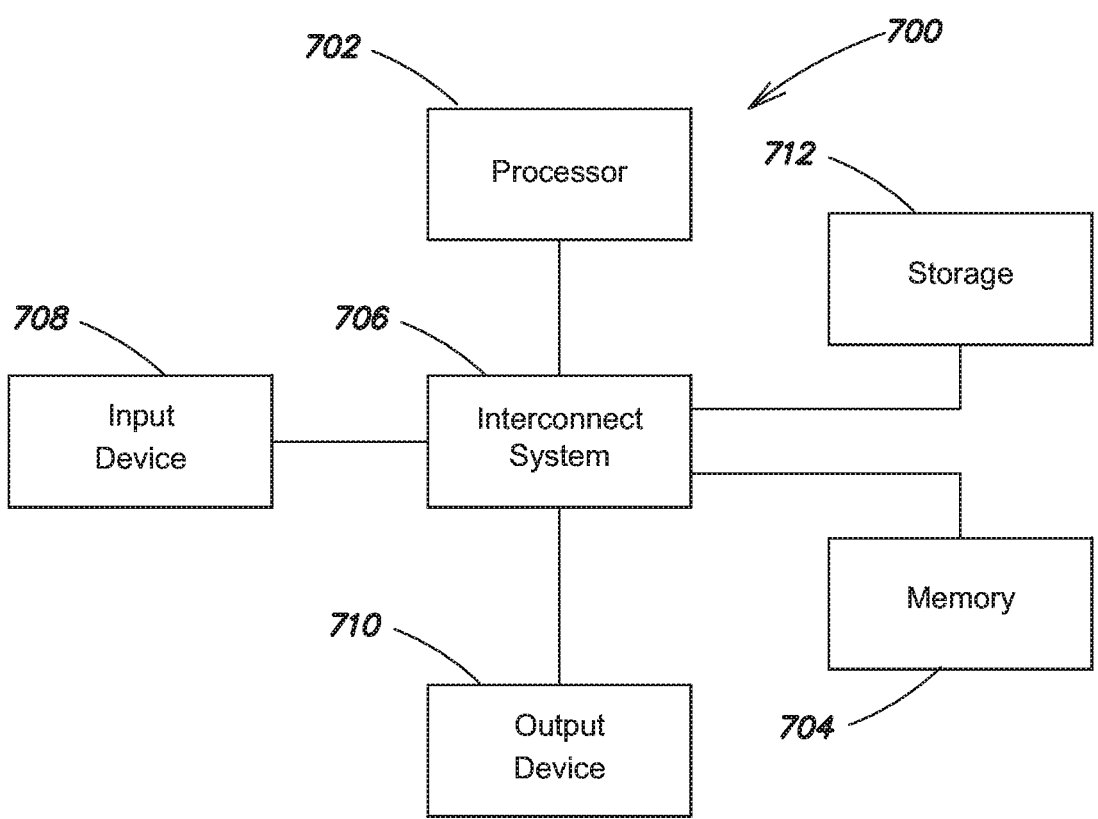
FIG. 7 is a schematic of a computer system including in embodiments of a system for graphically displaying events in a power system.

Although computer system 700 is shown by way of example as one type of computer system upon which various embodiments disclosed herein may be practiced, it should be appreciated that the embodiments disclosed herein are not limited to being implemented on the computer system as shown in FIG. 7. Various embodiments disclosed herein may be practiced on one or more computers having a different architecture or components that that shown in FIG. 6.

Computer system 700 may be a general-purpose computer system that is programmable using a high-level computer programming language. Computer system 700 may be also implemented using specially programmed, special purpose hardware. In computer system 700, processor 702 is typically a commercially available processor such as the well-known Pentium™ or Core™ class processors available from the Intel Corporation. Many other processors are available. Such a processor usually executes an operating system which may be, for example, the Windows 7 or Windows 8 operating system available from the Microsoft Corporation, the MAC OS System X available from Apple Computer, the Solaris Operating System available from Sun Microsystems, or UNIX available from various sources. Many other operating systems may be used.

The processor and operating system together define a computer platform for which application programs in high-level programming languages are written. It should be understood that embodiments disclosed herein are not limited to a particular computer system platform, processor, operating system, or network. Also, it should be apparent to those skilled in the art that the embodiments disclosed herein are not limited to a specific programming language or computer system. Further, it should be appreciated that other appropriate programming languages and other appropriate computer systems could also be used.

One or more portions of the computer system may be distributed across one or more computer systems (not shown) coupled to a communications network. These computer systems also may be general-purpose computer systems. For example, various embodiments disclosed herein may be distributed among one or more computer systems configured to provide a service (e.g., servers) to one or more client computers, or to perform an overall task as part of a distributed system. For example, various embodiments disclosed herein may be performed on a client-server system that includes components distributed among one or more server systems that perform various functions according to various embodiments. These components may be executable, intermediate (e.g., IL) or interpreted (e.g., Java) code which communicate over a communication network (e.g., the Internet) using a communication protocol (e.g., TCP/IP). In some embodiments one or more components of the computer system 700 may communicate with one or more other components over a wireless network, including, for example, a cellular telephone network.

It should be appreciated that embodiments disclosed herein are not limited to executing on any particular system or group of systems. Also, it should be appreciated that embodiments disclosed herein are not limited to any particular distributed architecture, network, or communication protocol. Various embodiments may be programmed using an object-oriented programming language, such as Small-Talk, Java, C++, Ada, or C# (C-Sharp). Other object-oriented programming languages may also be used. Alternatively, functional, scripting, and/or logical programming languages may be used. Various embodiments disclosed herein may be implemented in a non-programmed environment (e.g., documents created in HTML, XML or other format that, when viewed in a window of a browser program, render aspects of a graphical-user interface (GUI) or perform other functions). Various embodiments disclosed herein may be implemented as programmed or non-programmed elements, or any combination thereof.

The system and methods described herein may be employed in any number of related applications. For example, a user may be provided the opportunity to selection a portion of readings, with the system then identifying similar historical readings to be displayed to the user. Such a visual query may allow a user investigating an event to locate previously-occurring events that may have been overlooked at the time they occurred. In the event that multiple previously-occurring events are identified, they may be displayed in a user interface and sorted by some criteria, such as occurrence date/time, similarity to the queried data, or a confidence level assigned by the system and/or a user. Similarly, the user may be provided the opportunity to query historic measurements by drawing a line having a shape that can be compared to the shapes of historic measurements, with potential matches being displayed to the user.

Having thus described several aspects of at least one embodiment of this invention, it is to be appreciated various alterations, modifications, and improvements will readily occur to those skilled in the art. Any feature described in any embodiment may be included in or substituted for any feature of any other embodiment. Acts of methods disclosed herein may be performed in alternate orders, and one or more of the acts may be omitted or replaced by an alternative act. The methods disclosed herein may include additional acts not explicitly described. Such alterations, modifications, and improvements are intended to be part of this disclosure, and are intended to be within the scope of the invention. Accordingly, the foregoing description and drawings are by way of example only.

What is claimed is:

1. A method for monitoring a power system, comprising:
receiving, from at least one component monitor in communication with components of the power system, a first set of readings for at least one of the power system components at an input of a central processing unit;
providing the first set of readings to be displayed in a graphical format on a user interface;
receiving a user selection of a portion of the first set of readings, and at least one user classification of the portion of the first set of readings, the at least one user classification indicating "normal" non-issue data;
identifying and removing portions of the first set of readings based on the at least one user classification to generate a modified set of readings, the modified set of readings corresponding to "abnormal" potential issue data in the first set of readings;
classifying the modified set of readings by at least one characteristic;
detecting the at least one characteristic in a second set of readings based on similarity(s) and/or dis-similarity(s) between the first set of readings and the second set of readings;
automatically classifying the second set of readings in response to the at least one characteristic being detected in the second set of readings based on the similarity(s) and/or dis-similarity(s) between the first set of readings and the second set of readings; and
controlling or performing, using a controller in communication with the central processing unit and the power system components, an operation on one or more aspects of the power system in response to the second set of readings being classified in response to the at least one characteristic being detected in the second set of readings.

2. The method of claim 1, wherein at least one of the user selection and the user classification is received from the user interface.

3. The method of claim 1, wherein at least one of the user selection and the user classification is at least partially audibly communicated to a user input device based on a viewing of the first set of readings in the user interface.

4. The method of claim 1, wherein the at least one characteristic is associated with one or more potential issues in the power system.

5. The method of claim 4, wherein the potential issues include power quality issues in the power system.

6. The method of claim 5, wherein the power quality issues include at least one of: a voltage sag, a voltage swell, a voltage transient, an instantaneous interruption, a momentary interruption, a temporary interruption, waveform distortion, power frequency variation, imbalance, and a long-duration root-mean-square (rms) variation.

7. The method of claim 1, wherein classifying the modified set of readings by at least one characteristic includes automatically sorting the "abnormal" potential data into one or more categories.

8. The method of claim 7, wherein the categories include one or more power quality categories, the power quality categories including at least one of sags, swells, frequency variations, phase imbalance, waveform distortion, and transients.

9. The method of claim 7, wherein the categories include at least one of real, reactive, apparent power changes, and power factor changes.

10. The method of claim 7, wherein at least some of the categories are associated with frequency-based categories, the frequency-based categories including at least one of: total voltage and/or current harmonic distortion, a specific harmonic component(s), interharmonic(s) distortion, and sub-harmonic distortion.

11. The method of claim 7, wherein at least some of the categories are based on sequence component values, the sequence component values including at least one of: positive, negative, zero sequence voltage(s) and current(s).

12. The method of claim 7, wherein the categories include non-energy-related characteristics, the non-energy-related characteristics including at least one of: data, time, load type(s), process, load related status change(s), shift, manufacturer, location, metadata, and meter type.

13. The method of claim 1, further comprising: subsequent to automatically classifying the second set of readings, evaluating each classification for additional common or dissimilar characteristics within the classification to identify new classifications or sub-classifications.

14. The method of claim 13, further comprising:
detecting the at least one characteristic and/or the additional common or dissimilar characteristics in a third set of readings based on similarity(s) and/or dis-similarity(s) between at least one of the first and second sets of readings and the third set of readings; and
automatically classifying the third set of readings in response to the at least one characteristic and/or the additional common or dissimilar characteristics being detected in the third set of readings based on the similarity(s) and/or dis-similarity(s) between at least one of the first and second sets of readings and the third set of readings.

15. The method of claim 13, wherein evaluating each classification for additional common or dissimilar characteristics within the classification to identify new classifications or sub-classifications includes: identifying trends or patterns in at least one of the first and second sets of readings to identify new classifications or sub-classifications.

16. The method of claim 15, wherein evaluating each classification for additional common or dissimilar characteristics to identify trends or patterns includes identifying optimal change points to slice the measurement into most discriminant and coherent classifications or sub-classifications.

17. The method of claim 16, wherein identifying the optimal change points includes optimizing the change point identification in a coherent way to adjust and correct approximate user selections.

18. The method of claim 16, wherein identifying optimal change points to slice the measurement into most discriminant and coherent classifications or sub-classifications includes: identifying missing change points to link to existing sub-classifications or to identify missing classifications.

19. The method of claim 16, further comprising: after optimizing the change point identification or after identifying missing change points or identifying missing sub-classifications, providing a user validation step or completion step.

20. The method of claim 15, further comprising: in response to identifying new classifications or sub-classifications, comparing the new classifications or sub-classifications with current classifications to determine differences between the current classifications and the new classifications or sub-classifications, and/or overlap between the current classifications and the new classifications or sub-classifications.

21. The method of claim 20, further comprising: determining if there have been any misclassifications and/or if at least one of the first and second sets of readings needs to be reclassified based on the determined differences and/or overlap between the current classifications and the new classifications or sub-classifications.

22. The method of claim 21, further comprising evaluating each of the new classifications or sub-classifications and/or overlaps to identify optimal change points to slice the measurement into most discriminant and coherent classifications or sub-classifications.

23. The method of claim 22, wherein evaluating each of the new classifications or sub-classifications and/or overlaps to identify optimal change points includes optimizing the change point identification in a coherent way to adjust and correct approximate user selections.

24. The method of claim 21, further comprising: in response to determining that there have been misclassifications and/or at least one of the first and second sets of readings needs to be reclassified, reprocessing at least one of the first and second sets of readings to reclassify the first and/or second sets of readings.

25. The method of claim 1, further comprising:
determining if there are any unclassified readings; and
in response to determining there is at least one unclassified reading, identifying and indicating new abnormal readings that are unclassified.

26. The method of claim 25, further comprising: classifying the unclassified readings by at least the at least one characteristic.

27. A system for monitoring a power system, comprising:
one or more component monitors in communication with components of the power system and configured to measure electrical or performance characteristics of the power system components or the power system;
a central processing unit in communication with the component monitors and configured to:
receive, from at least one of the component monitors, a first set of readings for at least one of the power system components at an input of a central processing unit;

provide the first set of readings to be displayed in a graphical format on a user interface;
receive a user selection of a portion of the first set of readings, and at least one user classification of the portion of the first set of readings, the at least one user classification indicating "normal" non-issue data;
identify and remove portions of the first set of readings based on the at least one user classification to generate a modified set of readings, the modified set of readings corresponding to "abnormal" potential issue data in the first set of readings;
classify the modified set of readings by at least one characteristic;
detect the at least one characteristic in a second set of readings based on similarity(s) and/or dis-similarity(s) between the first set of readings and the second set of readings;
automatically classify the second set of readings in response to the at least one characteristic being detected in the second set of readings based on the similarity(s) and/or dis-similarity(s) between the first set of readings and the second set of readings; and
a controller in communication with the central processing unit and the power system components, the controller configured to control or perform an operation on one or more aspects of the power system in response to the second set of readings being classified in response to the at least one characteristic being detected in the second set of readings.

* * * * *